US010911706B2

(12) United States Patent
Ishii

(10) Patent No.: US 10,911,706 B2
(45) Date of Patent: Feb. 2, 2021

(54) SOLID-STATE IMAGING ELEMENT AND ELECTRONIC EQUIPMENT

(71) Applicant: SONY CORPORATION, Tokyo (JP)

(72) Inventor: Shunsuke Ishii, Kumamoto (JP)

(73) Assignee: SONY CORPORATION, Tokyo (JP)

( * ) Notice: Subject to any disclaimer, the term of this patent is extended or adjusted under 35 U.S.C. 154(b) by 68 days.

(21) Appl. No.: 16/319,400

(22) PCT Filed: Jul. 6, 2017

(86) PCT No.: PCT/JP2017/024783
§ 371 (c)(1),
(2) Date: Jan. 21, 2019

(87) PCT Pub. No.: WO2018/030043
PCT Pub. Date: Feb. 15, 2018

(65) Prior Publication Data
US 2019/0222791 A1    Jul. 18, 2019

(30) Foreign Application Priority Data

Aug. 9, 2016  (JP) .................................. 2016-156735

(51) Int. Cl.
*H04N 5/3745* (2011.01)
*H04N 5/369* (2011.01)
(Continued)

(52) U.S. Cl.
CPC ....... *H04N 5/37455* (2013.01); *H01L 27/146* (2013.01); *H01L 27/1464* (2013.01);
(Continued)

(58) Field of Classification Search
CPC ............. H04N 5/37455; H04N 5/3572; H04N 5/3696; H01L 27/146; H01L 27/14603;
(Continued)

(56) References Cited

U.S. PATENT DOCUMENTS 7,135,698 B2 * 11/2006 Mitra ................ H01L 27/14649
257/21
2015/0028749 A1 * 1/2015 Sun ......................... H05B 45/10
315/151

FOREIGN PATENT DOCUMENTS

JP    61-296758 A    12/1986
JP    2006-108467 A    4/2006

OTHER PUBLICATIONS

International Search Report and Written Opinion of PCT Application No. PCT/JP2017/024783, dated Aug. 22, 2017, 06 pages of ISRWO.

* cited by examiner

*Primary Examiner* — Georgia Y Epps
*Assistant Examiner* — Don J Williams
(74) *Attorney, Agent, or Firm* — Chip Law Group

(57) ABSTRACT

Shading correction is realized without sacrificing a noise characteristic and a sensitivity characteristic. A solid-state imaging element includes a plurality of pixels that are arranged two-dimensionally and each outputs analog voltage proportional to electron produced by photodiode and an AD conversion section that convert analog voltages output from the pixels into digital signals. First and second pixels included in the plurality of pixels differ in conversion efficiency with which a unit quantity of electrons output from the photodiodes are converted into the analog voltages.

8 Claims, 26 Drawing Sheets

(51) Int. Cl.
*H01L 27/146* (2006.01)
*H04N 5/357* (2011.01)
*H04N 9/04* (2006.01)

(52) U.S. Cl.
CPC .. *H01L 27/14603* (2013.01); *H01L 27/14614* (2013.01); *H01L 27/14643* (2013.01); *H04N 5/3572* (2013.01); *H04N 5/369* (2013.01); *H04N 5/3696* (2013.01); *H04N 9/04557* (2018.08)

(58) Field of Classification Search
CPC ........... H01L 27/14614; H01L 27/1464; H01L 27/14643
See application file for complete search history.

FI. 21B

SOLID-STATE IMAGING ELEMENT AND ELECTRONIC EQUIPMENT

CROSS REFERENCE TO RELATED APPLICATIONS

This application is a U.S. National Phase of International Patent Application No. PCT/JP2017/024783 filed on Jul. 6, 2017, which claims priority benefit of Japanese Patent Application No. JP2016-156735 filed in the Japan Patent Office on Aug. 9, 2016. Each of the above-referenced applications is hereby incorporated herein by reference in its entirety.

TECHNICAL FIELD

The present technology relates to a solid-state imaging element and electronic equipment.

BACKGROUND ART

Shading correction has been commonly conducted on image signals that have undergone analog/digital conversion. For example, patent document 1 discloses shading correction realized by digital gain correction performed on output data that has undergone digital conversion by retaining, in advance, a correction table that defines a shading correction amount for each view angle position and referring to the correction table.

Also, technologies are also disclosed that perform shading correction by using a light condensing structure and controlling a pixel output value in advance (refer, for example, to PTL 2). In the technology disclosed in PTL 2, shading correction is performed by changing light condensing efficiency of on-chip lenses (e.g., lens diameter). Specifically, sensitivity of an image region as a whole is adjusted to an approximately uniform level by reducing the light condensing efficiency of a highly sensitive photoelectric conversion region such as a peripheral portion of the pixel region as compared to a highly sensitive photoelectric conversion region such as a center portion of the pixel region.

CITATION LIST

Patent Literature

[PTL 1]
Japanese Patent Laid-Open No. 2014-179735
[PTL 2]
Japanese Patent Laid-Open No. 2005-197379

SUMMARY

Technical Problem

According to the technology described in the above PTL 1 1, shading correction is performed by a digital process that multiplies an image signal that has undergone analog/digital conversion by a factor for each view angle. For example, in the case where the shading is corrected such that image signals output from the pixels located at edges of the view angle are ½ the image signals output from the pixels located at the center (the closer the pixels are to the center with lower image heights, the higher the sensitivity, and the closer the pixels are to the periphery with higher image heights, the lower the sensitivity), a signal-to-noise relationship is as depicted in FIGS. 24A, 24B, 24C, 24D, and 24E.

It should be noted that, in the example depicted in FIGS. 24A, 24B, 24C, 24D, and 24E, a saturation electron count is 6000e-, an analog/digital conversion factor is 0.35 mV/LSB (Least Significant Bit), and dark random noise is 120 μV☐rms (root mean square value). Also, a reference signal for calculating S/N is at the time of a 128-fold gain (1/10 the output of full code (6000e-/128/10=4.7e-)).

FIG. 24A depicts shading. In FIG. 24A, shading is assumed in which the output of the center pixel output is 4.7e-, and the output of the view angle edge pixel is 2.3e-. The value depicted in FIG. 24A corresponds to "S" at the time of S/N calculation.

FIG. 24B depicts optical shot noise within the view angle. Optical shot noise corresponds to a square root of the output value depicted in FIG. 24A. FIG. 24C depicts dark noise. Dark noise is uniform (2e-) within the view angle because comparable levels of dark noise are superimposed on the outputs of all pixels. FIG. 24D depicts a distribution, within the view angle, of total noise combining optical shot noise and dark random noise. The total noise distribution within the view angle is the square root of sum of squares of two types of noise. The value depicted in FIG. 24D corresponds to "N" at the time of S/N calculation.

FIG. 24E depicts an S/N ratio (20 Log(S/N)) calculated by using "S" depicted in FIG. 24A and "N" depicted in FIG. 24D. In the case where digital gain correction has been performed such that the output values after digital calculation are approximately uniform, the S/N ratio remains unchanged from that with no correction. This results in conspicuous aggravation of the S/N ratio of the pixels with elevated heights.

In the technology described in the above PTL 2, on the other hand, shading correction is performed by changing the light condensing efficiency of the on-chip lenses. Therefore, in the case where the highest light condensing efficiency is realized for the peripheral pixels, light condensing efficiency lower than the highest light condensing efficiency is applied to the center pixels. For example, in the case where the shading is corrected such that output from the pixels located at the view angle edges are half the output from the pixels located at the center, the light condensing efficiency of the on-chip lenses is half the efficiency in the case of application of the highest light condensing efficiency, resulting in a significant loss in terms of S/N ratio.

The present technology has been devised in light of the foregoing problem and proposes shading correction that can be performed without sacrificing noise characteristic and sensitivity characteristic.

Solution to Problem

One aspect of the present technology is a solid-state imaging element including a plurality of pixels that are arranged two-dimensionally and each outputs analog voltage proportional to electron produced by photodiode, and an AD conversion section that convert analog voltages output from the pixels into digital signals. First and second pixels included in the plurality of pixels differ in conversion efficiency with which a unit quantity of electrons output from the photodiodes are converted into the analog voltages.

It should be noted that the above solid-state imaging element and an imaging apparatus include a variety of modes such as one carried out with the solid-state imaging element and the imaging apparatus incorporated in other apparatus and one carried out together with other method.

Also, the present technology can be realized as an imaging system that includes the above solid-state imaging element and the imaging apparatus.

Advantageous Effect of Invention

According to the present technology, it is possible to realize shading correction that can be performed without sacrificing noise characteristic and sensitivity characteristic. It should be noted that the effect described in the present specification is merely depictive and not restrictive and that there may be additional effects.

BRIEF DESCRIPTION OF DRAWINGS

FIGS. 21A, 21B, and 21C are diagrams describing adjustment of the EV conversion efficiency made by adjusting a thickness of a gate insulating film of the amplifying transistor.

DESCRIPTION OF EMBODIMENTS

Figure 1:
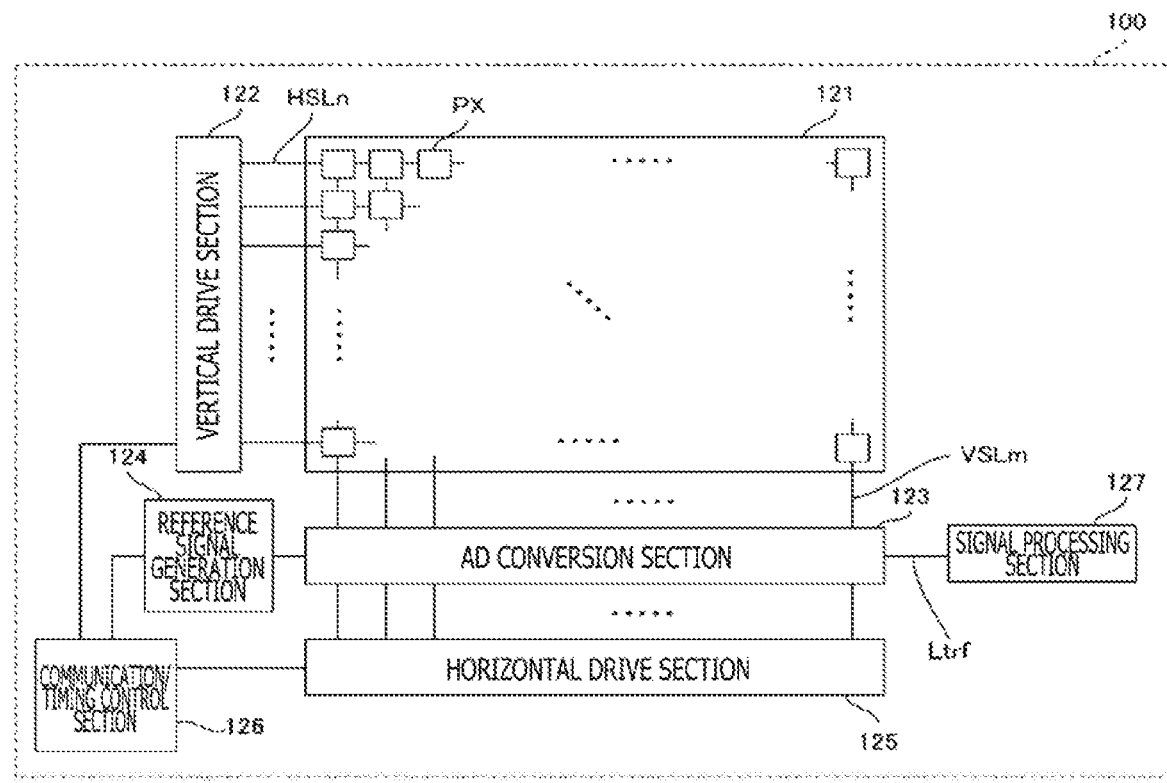
FIG. 1 is a block diagram depicting a configuration of a solid-state imaging element.

The present technology will be described in the following order:
(1) First Embodiment
(2) Second Embodiment
(3) Third Embodiment
(4) Application Example to Endoscopic Surgery System
(5) Application Example to Mobile Body (1) First Embodiment FIG. 1 is a block diagram depicting a configuration of a solid-state imaging element 100. In the present embodiment, a description will be given by taking, as an example, a CMOS image sensor, a type of an X-Y address solid-state imaging apparatus. A description will be given below of a specific example of a solid-state imaging apparatus as a CMOS image sensor with reference to FIG. 1.

In FIG. 1, the solid-state imaging element 100 includes a pixel section 121, a vertical drive section 122, an analog/digital conversion section (AD conversion section) 123, a reference signal generation section 124, a horizontal drive section 125, a communication/timing control section 126, and a signal processing section 127.

The pixel section 121 has a plurality of pixels PX including photodiodes as photoelectric conversion sections that are arranged two-dimensionally. A color filter array is provided on a light-receiving side of the pixel section 121. The color filter array is partitioned such that each pixel corresponds to a filter color. It should be noted that a specific circuit configuration of the pixel PX will be described later.

The pixel section 121 has n pixel drive lines HSLn (where n=1, 2, and so on) and m vertical signal lines VSLm (where m=1, 2, and so on) arranged therein. The pixel drive lines HSLn are arranged such that their lengthwise direction runs horizontally in FIG. 1 (arrangement direction of the pixels of the pixel rows/horizontal direction) and are arranged vertically at equal intervals in FIG. 1. The vertical signal lines VSLm are arranged such that their lengthwise direction runs vertically in FIG. 1 (arrangement direction of the pixels of the pixel columns/vertical direction) and arranged horizontally at equal intervals in FIG. 1.

One ends of the pixel drive lines HSLn are connected to output terminals corresponding to respective rows of the vertical drive section 122. The vertical signal lines VSLm are connected to the pixels PX in respective columns, and one ends thereof are connected to the AD conversion section 123. The vertical drive section 122 and the horizontal drive section 125 perform control, under control of the communication/timing control section 126, such that analog signals are sequentially read from the respective pixels PX included in the pixel section 121. It should be noted that specific connection of the pixel drive line HSLn and the vertical signal line VSLm to each of the pixels PX will be described later together with the description of the pixel PX.

The communication/timing control section 126 includes, for example, a timing generator and a communication interface. The timing generator generates a variety of clock signals on the basis of an externally input clock (master clock). The communication interface receives data specifying an operation mode supplied from outside the solid-state imaging element 100 and outputs data including internal information of the solid-state imaging element 100 to external equipment.

The communication/timing control section 126 generates, on the basis of the master clock, a clock at the same frequency as the master clock, a clock at half the frequency thereof, and a low-speed clock at a frequency obtained by dividing the frequency thereof further, and so on and supplies these clocks to the respective sections of the device (e.g., the vertical drive section 122, the AD conversion section 123, the reference signal generation section 124, the horizontal drive section 125, the signal processing section 127).

The vertical drive section 122 includes, for example, a shift register, an address decoder, and so on. The vertical drive section 122 includes a vertical address setting section for controlling row addresses and a row scan control section for controlling row scanning on the basis of a signal obtained by decoding an externally input video signal.

The vertical drive section 122 is capable of readout scanning and sweep scanning.

Readout scanning is scanning intended to sequentially select unit pixels from which to read out signals. Readout scanning is basically performed on a row-by-row basis and sequentially. However, in the case where some pixels are skipped by adding or adding and averaging outputs of the plurality of pixels having a given positional relationship, readout scanning is performed in a given order.

Sweep scanning, performed on a row or a combination of pixels to be read out by readout scanning, is intended to reset unit pixels that belong to the row or the combination of pixels to be read out shutter speed's worth of time ahead of readout scanning.

The horizontal drive section 125 sequentially selects each ADC circuit included in the AD conversion section 123 in synchronism with a clock output from the communication/timing control section 126. The AD conversion section 123 includes the ADC circuits (where m=1, 2, and so on), one provided for each of the vertical signal lines VSLm, converting an analog signal output from each of the vertical signal lines VSLm into a digital signal and outputting, under control of the horizontal drive section 125, the digital signal to a horizontal signal line Ltrf.

The horizontal drive section 125 includes, for example, a horizontal address setting section and a horizontal scanning section, selecting the ADC circuits of the AD conversion section 123, one at a time, corresponding to horizontal columns to be read out defined by the horizontal address setting section and guiding the digital signal, generated by the selected ADC circuit, onto the horizontal signal line Ltrf.

Thus, the digital signals output from the AD conversion section 123 are input to the signal processing section 127 via the horizontal signal line Ltrf. The signal processing section 127 performs a process of converting the signals output from the pixel section 121 via the AD conversion section 123 into pixel signals corresponding to a color arrangement of the color filter array.

Also, the signal processing section 127 performs, as necessary, a process of skipping horizontal or vertical pixel signals by addition, addition and averaging, and so on. Pixel signals generated in this manner are output to external equipment outside the solid-state imaging element 100.

The reference signal generation section 124 includes a DAC (Digital Analog Converter) and generates a reference signal Vramp in synchronism with a count clock supplied from the communication/timing control section 126. The reference signal Vramp is a sawtooth wave (ramp wave) whose value changes stepwise from an initial value supplied from the communication/timing control section 126. This reference signal Vramp is supplied to each of the ADC circuits of the AD conversion section 123.

The AD conversion section 123 includes the plurality of ADC circuits. The ADC circuit compares, for conversion of an analog voltage output from each of the pixels PX into a digital form, the reference signal Vramp with the voltage of the vertical signal line VSLm with a comparator and counts, with a counter, the time it takes until before or after a relationship between the two in terms of magnitude is reversed during a given AD conversion period. This allows for generation of a digital signal in proportion to the analog pixel voltage. It should be noted that a specific example of the AD conversion section 123 will be described later.

Figure 2:
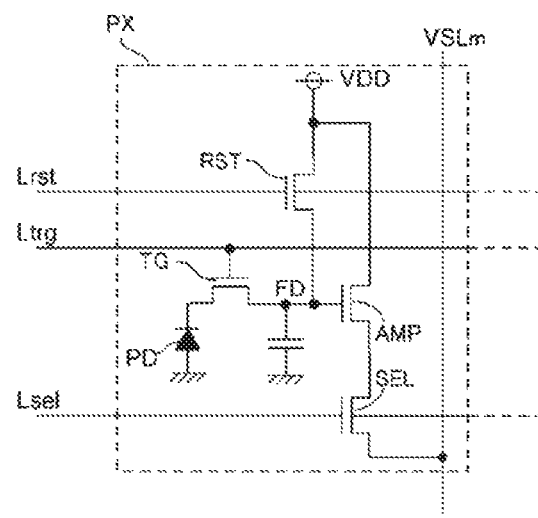
FIG. 2 is a diagram describing a circuit configuration of a pixel.

FIG. 2 is a diagram describing a circuit configuration of the pixel PX.

FIG. 2 depicts an equivalent circuit of a pixel having a common four-transistor configuration. The pixel PX depicted in FIG. 2 includes a photodiode PD and four transistors (transfer transistor TG, reset transistor RST, amplifying transistor AMP, and select transistor SEL).

The photodiode PD generates a current proportional to the amount of light received through photoelectric conversion. The photodiode PD has its anode connected to ground and its cathode connected to a drain of the transfer transistor TG.

The pixel PX is supplied with a variety of control signals from a reset signal generation circuit of the vertical drive section 122 and various drivers via signals Ltrg, Lrst, and Lsel.

The signal line Ltrg for transmitting a transfer gate signal is connected to a gate of the transfer transistor TG. The transfer transistor TG has its drain connected to a connection point between a source of the reset transistor RST and a gate of the amplifying transistor AMP. This connection point is included in a floating diffusion FD, capacitance for accumulating signal charge.

The transfer transistor TG turns ON when a transfer signal is input to the gate thereof via the signal line Ltrg, transferring the signal charge (photoelectrons here) that has been accumulated through photoelectric conversion by the photodiode PD to the floating diffusion FD.

The signal line Lrst for transmitting a reset signal is connected to a gate of the reset transistor RST, and a constant voltage source VDD is connected to a drain thereof. The reset transistor RST turns ON when a reset signal is input to the gate thereof via the signal line Lrst, resetting the floating diffusion FD to the voltage of the constant voltage source VDD. On the other hand, in the case where a reset signal is not input to the gate via the signal line Lrst, the reset transistor RST is OFF, forming a given potential barrier between the floating diffusion FD and the constant voltage source VDD.

The amplifying transistor AMP has its gate connected to the floating diffusion FD, its drain connected to the constant voltage source VDD, and its source connected to the drain of the select transistor SEL.

The signal line Lsel of the select signal is connected to the gate of the select transistor SEL, and the select transistor SEL has its source connected to the vertical signal line VSLm. The select transistor SEL turns ON when a control signal (address signal or select signal) is input to the gate thereof via the signal line Lsel and is OFF in the case where this control signal is not input via the signal line Lsel.

When the select transistor SEL turns ON, the amplifying transistor AMP outputs the voltage of the floating diffusion FD to the vertical signal line VSLm. The voltage output from each of the pixels PX via the vertical signal line VSLm is input to the AD conversion section 123.

It should be noted that the circuit configuration of the pixel PX is not limited to that depicted in FIG. 2 and that a variety of known configurations including three-transistor configurations and other four-transistor configurations can also be used. For example, a configuration having the select transistor SEL between the amplifying transistor AMP and the constant voltage source VDD is among examples of other four-transistor configurations.

Figure 3:
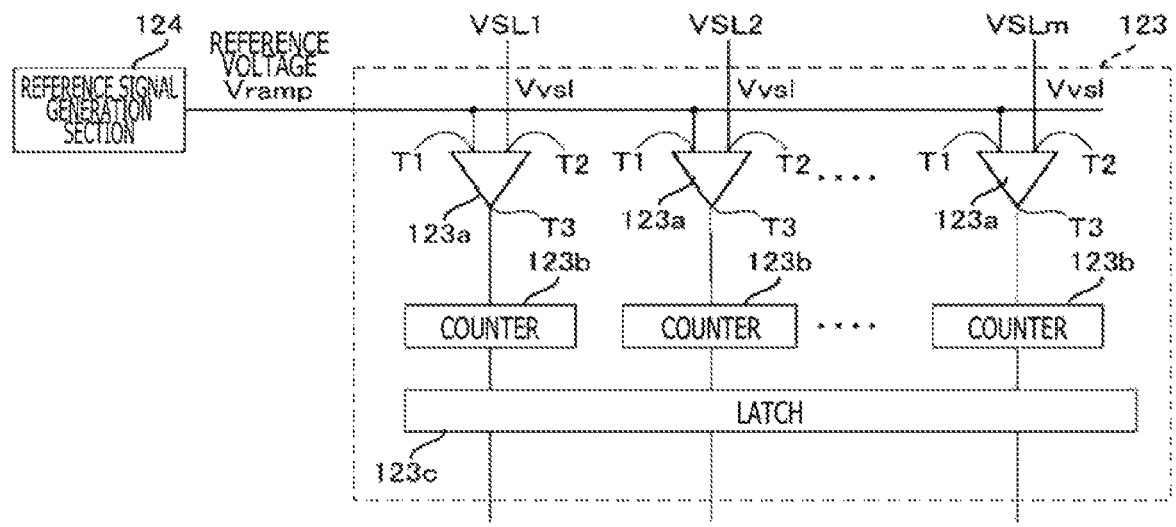
FIG. 3 is a diagram depicting a configuration of an AD conversion section.

FIG. 3 is a diagram depicting a configuration of the AD conversion section 123. As depicted in FIG. 3, each of the ADC circuits included in the AD conversion section 123 includes a comparator 123a, a counter 123b, and a latch 123c that are provided for each of the vertical signal lines VSLm.

The comparator 123a includes two input terminals T1 and T2 and an output terminal T3. The input terminal T1, one of the input terminals, receives input of the reference signal Vramp from the reference signal generation section 124, and the input terminal T2, the other input terminal, receives input of an analog pixel signal (hereinafter denoted as a pixel signal Vvsl) output from the pixel PX via the vertical signal line VSLm.

The comparator 123a compares the reference signal Vramp with the pixel signal Vvsl. The comparator 123a outputs a high- or low-level signal in keeping with the relationship between the reference signal Vramp and the pixel signal Vvsl in terms of magnitude. When the relationship between the reference signal Vramp and the pixel signal Vvsl in terms of magnitude is reversed, the output of the output terminal T3 changes from high to low level or vice versa.

The counter 123b is supplied with a clock from the communication/timing control section 126 and counts the time it takes from the beginning to the end of the AD conversion using this clock. The timings at which the AD conversion begins and ends are identified on the basis of a control signal output from the communication/timing control section 126 (e.g., presence or absence of input of a clock signal CLK) and output inversion of the comparator 123a.

Also, the counter 123b converts pixel signals from analog into digital form through so-called correlation double sampling (CDS). Specifically, the counter 123b counts down under control of the communication/timing control section 126 while an analog signal corresponding to a reset component is output from the vertical signal line VSLm and then counts up using the count value, obtained from the down-counting, as an initial value while an analog signal corresponding to a pixel signal is output from the vertical signal line VSLm.

The count value generated in this manner is a digital value corresponding to the difference between the signal component and the reset component. That is, the value is obtained by correcting, with the reset component, the digital value corresponding to the analog pixel signal input to the AD conversion section 123 from the pixel PX via the vertical signal line VSLm.

The digital values generated by the counters 123b are stored in the latch 123c and are sequentially output from the latch 123c under control of the horizontal scanning section and output to the signal processing section 127 via the horizontal signal line Ltrf.

Figure 4:
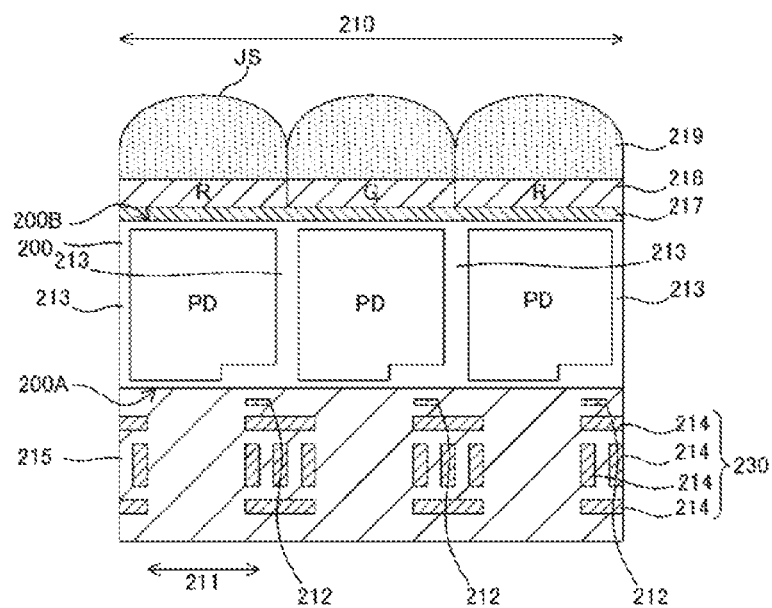
FIG. 4 is a diagram sectionally depicting structures of main components of the solid-state imaging element.

FIG. 4 is a diagram sectionally depicting structures of main components of the solid-state imaging element 100. It should be noted that although a back-illuminated CMOS image sensor is taken as an example in the present embodiment, a front-illuminated CMOS image sensor, of course, may also be used.

The solid-state imaging element 100 depicted in FIG. 4 is a back-illuminated CMOS image sensor and includes, for example, a pixel region 210 (so-called imaging region) and a peripheral circuit section (not depicted) arranged peripheral of the a pixel region 210. The plurality of pixels PX are arranged on a silicon semiconductor substrate 200 in the pixel region 210.

Pixel transistors are formed on the side of a substrate front surface 200A, and FIG. 4 schematically depicts the existence of pixel transistors by depicting gate electrodes 212. The photodiodes PD are separated one from the other by an element separation layer 213 that includes an impurity diffusion layer.

An interconnect layer 230 is formed on the side of the front surface of the semiconductor substrate 200 where the pixel transistors are formed. The interconnect layer 230 has a plurality of interconnects 214 formed via an interlayer insulating film 215. Therefore, the interconnects 214 can be formed in a back-illuminated CMOS image sensor regardless of the positions of the photodiodes PD.

On a back surface 200B of the semiconductor substrate 200 which the photodiodes PD face, a planarization film 217 is formed. On an upper surface of the planarization film 217, color filters 218 are formed in such a manner as to correspond to the respective photodiodes PD. In the present embodiment, a description will be given by taking, as an example, a Bayer pattern configuration having three primary colors, namely, red, green, and blue, as the color filters 218.

The color filters 218 include, for example, three primary colors, i.e., red, blue, and green, and a red color filter 218R includes a red material that passes long wave red light (approximately 600 to 700 nm) in a visible range and absorbs light other than red light, and a green color filter 218G includes a green material that passes medium wave green light (approximately 500 to 600 nm) in the visible range and absorbs light other than green light, and a blue color filter 218B includes a blue material that passes short wave blue light (approximately 400 to 500 nm) in the visible range and absorbs light other than blue light. On the upper surface of the color filters 218, microlenses 219 are formed in such a manner as to correspond to the respective photodiodes PD.

The microlenses 219 are provided on the side of the back surface 200B of the semiconductor substrate 200 and on top of the color filters 218 as depicted in FIG. 4. The plurality of microlenses 219 are provided in the same shape in such a manner as to correspond to the plurality of photodiodes PD arranged in the pixel region 210. The microlenses 219 are convex lenses formed such that their centers are thicker than their edges in the direction from a light-receiving surface JS toward the side of the color filters 218 and are configured such that incident light is concentrated on the approximate center of the light-receiving surface of each photodiode PD and passed.

Thus, the color filters 218 and the microlenses 219 are provided, one each, for each of the pixels PX, and incident light from a condenser lens 111 enters the light-receiving surface of the corresponding photodiode PD via the microlens 219 and the color filter 218.

Figure 5A:
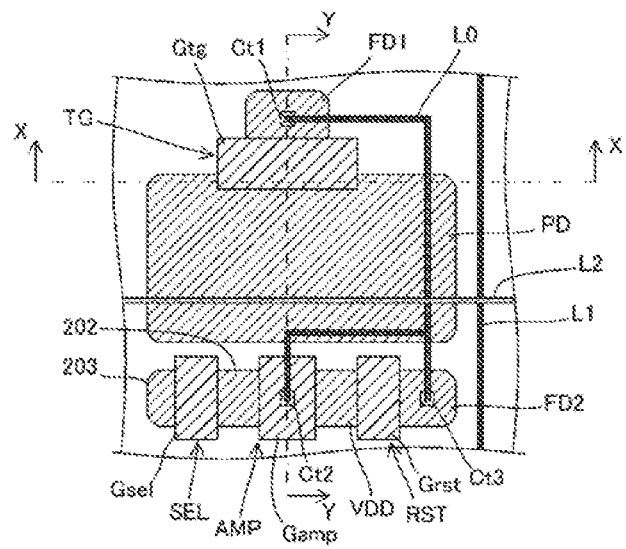
FIGS. 5A, 5B, and 5C are diagrams depicting an example of a pixel structure of the solid-state imaging element.

FIG. 5A is a diagram depicting an example of the structure of the pixel PX of the solid-state imaging element 100. FIG. 5A is a schematic plan view depicting main components of the pixel PX, FIG. 5B is a sectional view along line X-X depicted in FIG. 5A, and FIG. 5C is a sectional view along line Y-Y depicted in FIG. 5A.

Figure 5B:
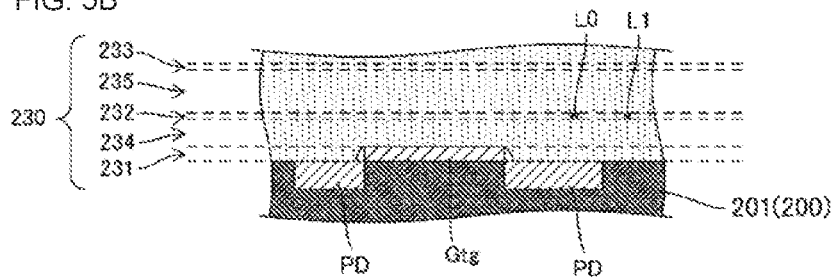
Figure 5C:
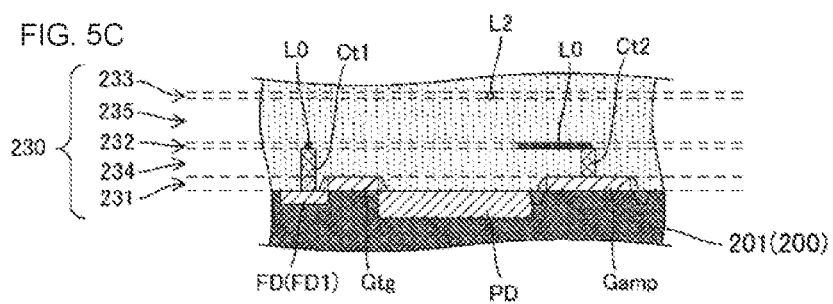

Although FIGS. 5A, 5B, and 5C depict a configuration in which a floating diffusion is provided for each photodiode of each of the pixels PX, the number of pixels sharing one floating diffusion can be changed in various ways. For example, a four-pixel-sharing configuration in which four photodiodes share a floating diffusion or a two-pixel-sharing configuration in which two photodiodes share a floating diffusion can be used. In the case of a four-pixel-sharing configuration or a two-pixel-sharing configuration, one transfer transistor is provided for each photodiode, and a reset transistor, an amplifying transistor, and a select transistor are provided for each sharing unit.

The pixel PX has a structure formed by stacking the interconnect layer 230 on the semiconductor substrate 200 in the direction along a thickness of the solid-state imaging element 100.

The interconnect layer 230 includes a gate layer 231, a first metal layer 232, a second metal layer 233, a first interlayer insulating layer 234, and a second interlayer insulating layer 23 in order from the side of the semiconductor substrate 200. The gate electrodes of the pixel transistors (the transfer transistor, the reset transistor, the amplifying transistor, and the select transistor) are formed in the gate layer 231. A metal interconnect provided in a layer above the gate layer 231 is formed in the first metal layer 232. The metal interconnect provided in a layer above the first metal layer 232 is formed in the second metal layer 233. The first interlayer insulating layer 234 is provided between the semiconductor substrate 200, the gate layer 231, and the first metal layer 232. The second interlayer insulating layer 23 is provided between the first metal layer 232 and the second metal layer 233. A contact connecting the gate electrode, the floating diffusion FD, and the metal interconnect of the first metal layer 232 is formed in such a manner as to penetrate the first interlayer insulating layer 234, and a through electrode connecting the metal interconnect of the second metal layer 233 and the metal interconnect of the first metal layer 232 is formed in such a manner as to penetrate a second interlayer insulating layer 235.

In the semiconductor substrate 200, a P-type well region 201 is formed in an area close to the interconnect layer 230. The photodiodes PD, the floating diffusion FD, and source/drain regions of various pixel transistors as transistor elements are formed in the well region 201. It should be noted that the gate electrodes of the pixel transistors are formed on the side of the interconnect layer 230, with a gate insulating film, not depicted, provided between the gate electrodes and the semiconductor substrate 200.

The photodiodes PD have a PN junction that includes a P-type semiconductor region with high impurity concentration and an N-type semiconductor region. The P-type semiconductor region is formed in an area close to the front surface of the well region 201. The N-type semiconductor region is formed adjacent to the back side of the P-type semiconductor region in the well region 201.

The floating diffusion FD is formed in the well region 201 as an N-type semiconductor region with high impurity concentration. In the present embodiment, the floating diffusion FD has a first region FD1 and a second region FD2. In plan view, the first region FD1 is formed on one side of a formation region of the photodiode PD, and the second region FD2 is formed on the other side of the formation region of the photodiode PD. The photodiode PD and the first and second regions FD1 and FD2 are formed to be separate from each other in the well region 201. The reset transistor RST, the amplifying transistor AMP, and the select transistor SEL are formed on the same side of the formation region of the photodiode PD as the second region FD2.

The first region FD1 is connected to the photodiode PD via the transfer transistor TG. The first region FD1 and the second region FD2 are connected to an amplifying gate electrode Gamp via contacts Ct1, t2, and Ct3 and an FD interconnect L0 as a metal interconnect formed in the first metal layer 232. It should be noted that although the FD interconnect L0 depicted in FIGS. 5A, 5B, and 5C has a structure that branches off into three halfway through, a combination of two interconnects that connect any two of the contacts Ct1, Ct2, and Ct3 may be used without providing a branch structure. Also, the floating diffusion FD may include only the second region FD2, and the second region FD2 and the photodiode PD may be connected via the transfer transistor TG, and the FD interconnect L0 may include only an interconnect that connects the second region FD2 and the amplifying gate electrode Gamp.

The transfer transistor TG is provided between the floating diffusion FD and the photodiode PD. A transfer gate electrode Gtg, the gate electrode of the transfer transistor TG, is formed in the gate layer 231 above the well region 201 between the floating diffusion FD and the photodiode PD. The transfer gate electrode Gtg is provided in such a manner as to cover the well region 201 between the floating diffusion FD and the photodiode PD via a gate insulating film that is not depicted.

The reset transistor RST is provided between the second region FD2 and the constant voltage section VDD. The constant voltage section VDD is formed as an N-type semiconductor region with high impurity concentration in the well region 201 and serves both as the drain of the reset transistor RST and the drain of the amplifying transistor AMP. A reset gate electrode Grst, the gate electrode of the reset transistor RST, is formed in the gate layer 231 above the well region 201 between the second region FD2 and the constant voltage section VDD. The reset gate electrode Grst is provided in the gate layer 231 in such a manner as to cover the well region 201 between the second region FD2 and the constant voltage section VDD via a gate insulating film that is not depicted. The constant voltage section VDD is connected to the constant voltage source VDD via contacts, metal interconnects, vias, and so on that are not depicted.

The amplifying transistor AMP is provided between the constant voltage section VDD and a diffusion layer 202. The diffusion layer 202 is formed as an N-type semiconductor region with high impurity concentration in the well region 201 and serves both as the source of the reset transistor RST and the drain of the select transistor SEL. In the layer above the well region 201 between the constant voltage section VDD and the diffusion layer 202, the amplifying gate electrode Gamp is formed in the gate layer 231. The amplifying gate electrode Gamp is provided in the gate layer 231 in such a manner as to cover the well region 201 between the constant voltage section VDD and the diffusion layer 202 via a gate insulating film that is not depicted.

The select transistor SEL is provided between the diffusion layer 202 and a diffusion layer 203. The diffusion layer 203 is formed as an N-type semiconductor region with high impurity concentration in the well region 201 and is included in the source of the select transistor SEL. A select gate electrode Gsel is formed in the gate layer 231 above the well region 201 between the diffusion layer 202 and the diffusion layer 203. The select gate electrode Gsel is provided in the gate layer 231 in such a manner as to cover the well region 201 between the diffusion layer 202 and the diffusion layer 203 via a gate insulating film that is not depicted. The diffusion layer 203 is connected to the vertical signal line VSLm via contacts, metal interconnects, vias, and so on that are not depicted.

In addition to the above, of the metal interconnects other than the FD interconnect L0 provided in the same pixel PX, the interconnect formed in the first metal layer 232 will be referred to as a same layer interconnect L1, and the interconnect formed in the second metal layer 233 will be referred to as a different layer interconnect L2.

As described above, the pixel PX included in the solid-state imaging element 100 is configured such that electrons generated by the photodiode PD are output via the pixel transistors, the floating diffusion FD, and the FD interconnect L0 as an analog voltage. The analog voltage output onto the vertical signal line VSLm is converted into a digital signal by the AD conversion section 123 described above.

Here, the solid-state imaging element 100 includes the pixels PX that differ in conversion efficiency for converting a unit quantity of electrons output from the photodiode PD into an analog voltage (hereinafter denoted as EV conversion efficiency). For example, there is a difference in incident light intensity arising from characteristics of optics and the imaging system (hereinafter denoted as uneven brightness) between the pixels PX included in the solid-state imaging element 100, and each pixel PX has EV conversion efficiency that has been adjusted in keeping with this uneven brightness. That is, the EV conversion efficiency is increased for the pixels PX whose sensitivity drops due to uneven brightness, and the EV conversion efficiency is reduced for the pixels PX whose sensitivity improves due to uneven brightness.

As a more specific example, a possible method would be to ensure that a pixel PX1 as a first pixel located at the center portion of the pixel region 210 and a pixel PX2 as a second pixel located at the peripheral portion of the pixel region 210 differ in EV conversion efficiency. That is, the pixel PX2 located at the peripheral portion of the pixel region 210 commonly has lower incident light intensity than the pixel PX1 located at the center portion of the pixel region 210. Therefore, it is possible to bring the sensitivity of the pixel PX2 and the sensitivity of the pixel PX1 closer to each other by increasing the EV conversion efficiency of the pixel PX2 or reducing the EV conversion efficiency of the pixel PX1.

The EF conversion efficiency is adjusted by adjusting the structure or characteristic of at least one of the transfer transistor TG, the reset transistor RST, the amplifying transistor AMP, the select transistor SEL, the floating diffusion FD, or the metal interconnects included in the pixel PX. Changing the structures of the transfer transistor TG, the reset transistor RST, the amplifying transistor AMP, the select transistor SEL, the floating diffusion FD, and the metal interconnects changes the capacitance of the floating diffusion FD in the pixel PX (hereinafter denoted as "FD capacitance"), thereby changing the EV conversion efficiency of the pixel PX. That is, if the FD capacitance of the pixel PX drops, the EV conversion efficiency improves, and if the FD capacitance increases, the EV conversion efficiency drops. Also, changing the characteristics of the transfer transistor TG, the reset transistor RST, the amplifying transistor AMP, the select transistor SEL, the floating diffusion FD, and the metal interconnects changes the EV conversion efficiency of the pixel PX.

Thus, in the case where shading correction is performed by adjusting the EV conversion efficiency of the pixel PX, the sensitivity characteristic and a noise characteristic are as depicted in FIGS. 6A, 6B, 6C, 6D, and 6E. It should be noted that, in FIGS. 6A, 6B, 6C, 6D, and 6E, data in the case of the past shading correction depicted in FIGS. 24A, 24B, 24C, 24D, and 24E is depicted as "BEFORE SHADING CORRECTION" for comparison.

In the example depicted in FIGS. 6A, 6B, 6C, 6D, and 6E, the EV conversion efficiency is varied stepwise from the center toward the view angle edge from 60 μV/e- to 120 μV/e-. It should be noted that, in the example depicted in FIGS. 6A, 6B, 6C, 6D, and 6E, as with the example depicted in FIGS. 24A, 24B, 24C, 24D, and 24E, the saturation electron count is 6000e-, the analog/digital conversion factor is 0.35 mV/LSB, the dark random noise is 120 μV□rms, the output at the view angle edge is one half that at the center by shading, and the reference signal for calculating S/N is at the time of a 128-fold gain (1/10 output of the full code (6000e-/128/10=4.7e-).

Figure 6A:
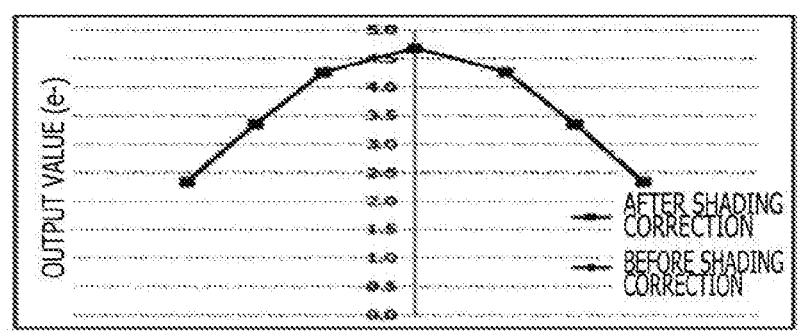
FIGS. 6A, 6B, 6C, 6D, and 6E are diagrams describing an effect of shading correction according to the present embodiment.

FIG. 6A depicts shading. As depicted in FIG. 6A, shading is assumed in which the output of the center pixel is 4.7e- and the output of the view angle edge pixel to 2.3e-. This value corresponds to "S" at the time of S/N calculation.

Figure 6B:
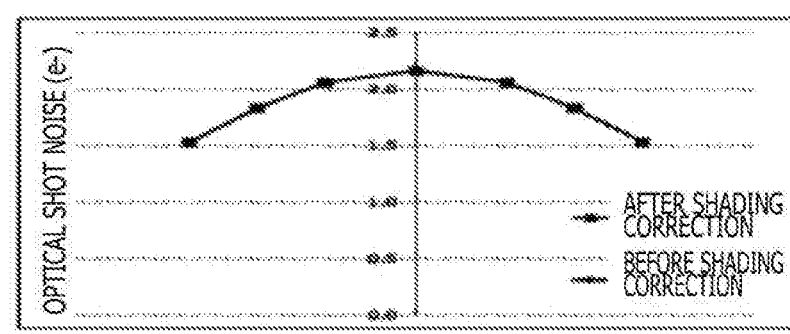
Figure 6C:
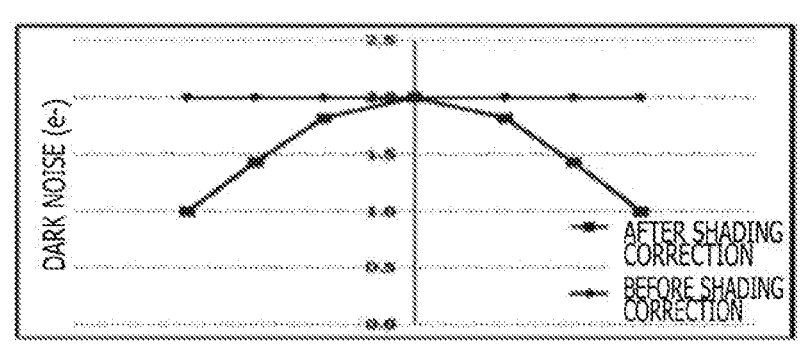
Figure 6D:
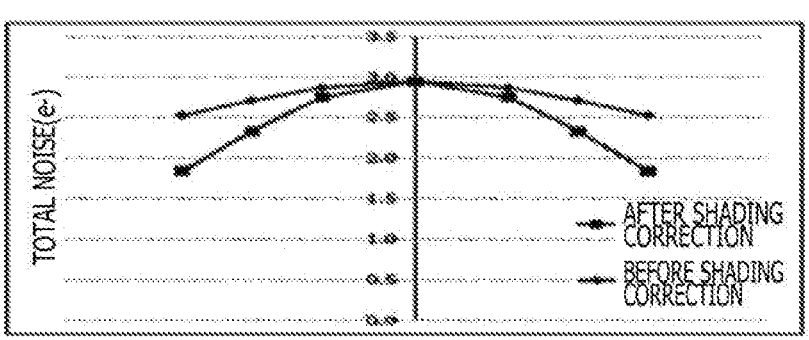

FIG. 6B depicts optical shot noise within the view angle. Optical shot noise corresponds to the square root of the output value depicted in FIG. 6A. FIG. 6C depicts dark noise. Because the EV conversion efficiency is varied stepwise from the center toward the view angle edge from 60 μV/e- to 120 μV/e-, dark noise (e-) is, in electron notation, 2e- at the center pixel and 1e- at the view angle edge pixel as opposed to noise (120 μV□rms) that occurs uniformly within the view angle. FIG. 6D depicts a distribution, within the view angle, of total noise combining optical shot noise and dark random noise. The total noise distribution within the view angle is the square root of sum of squares of two types of noise. This value is "N" at the time of S/N calculation. It is clear from FIG. 6D that the total noise at the view angle edge has diminished as compared to the past shading correction.

Figure 6E:
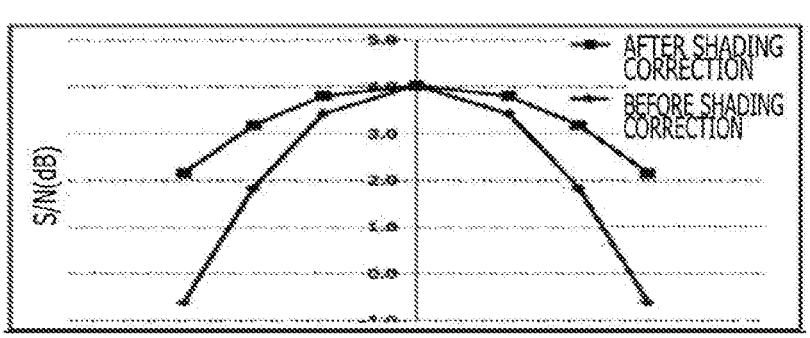

FIG. 6E depicts an S/N ratio (20 Log(S/N)) calculated by using "S" depicted in FIG. 6A and "N" depicted in FIG. 6D. In the example depicted in FIG. 6E, the S/N ratio at the view angle edge has improved by 1.8 dB. Thus, shading correction according to the present embodiment realizes pixel EV conversion efficiency by adjusting the EV conversion efficiency in keeping with shading, thereby preventing increase in dark noise (LSB rms). Also, no decrease in signal amount occurs at the center of the pixel region unlike shading correction using a light condensing structure. Therefore, the image quality (S/N ratio) associated with shading correction remains intact.

A description will be given below of specific examples of methods for adjusting EV conversion efficiency. FIGS. 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 14B, 140, 15A, 15B, 150, 16A, 16B, 160, 17A, 17B, 170, 18A, 18B, 180, 19A, 19B, 190, 20A, 20B, 20C, 21A, 21B, and 21C are diagrams for describing adjustment methods of the EV conversion efficiency, and the EV conversion efficiency is adjusted by adjusting, for each pixel, the structure or characteristic of one of the portions as compared to the pixel structure depicted in FIGS. 5A, 5B, and 5C. It should be noted that the structure or characteristic need not necessarily be adjusted on a pixel-by-pixel basis, and adjustment may be made such that the same structure or characteristic, to some extent, is available on an area-by-area basis, the areas being obtained by partitioning the pixel region 210.

Figure 7A:
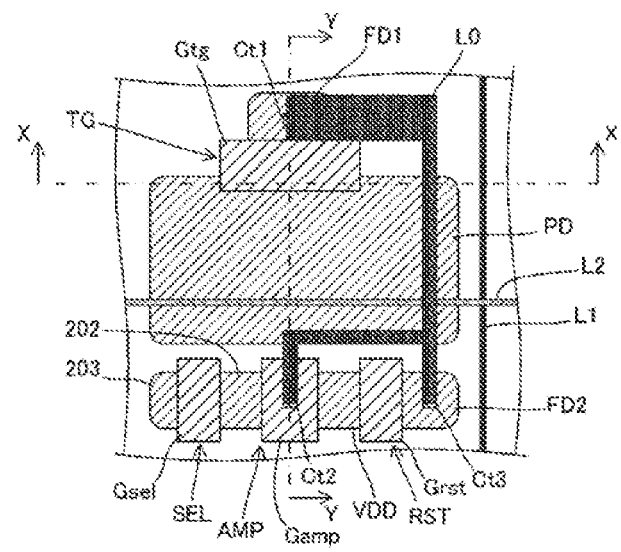
FIGS. 7A, 7B, and 7C are diagrams describing adjustment of EV conversion efficiency made by adjusting an FD interconnect width.
Figure 7B:
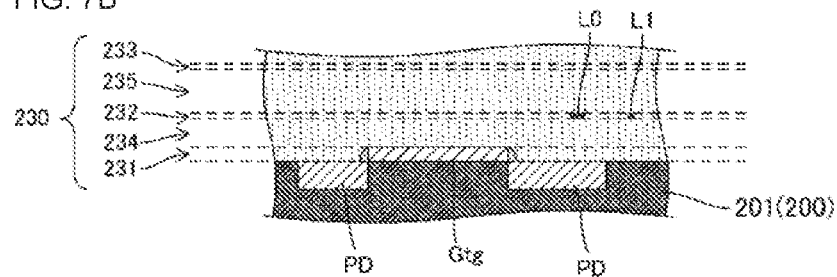
Figure 7C:
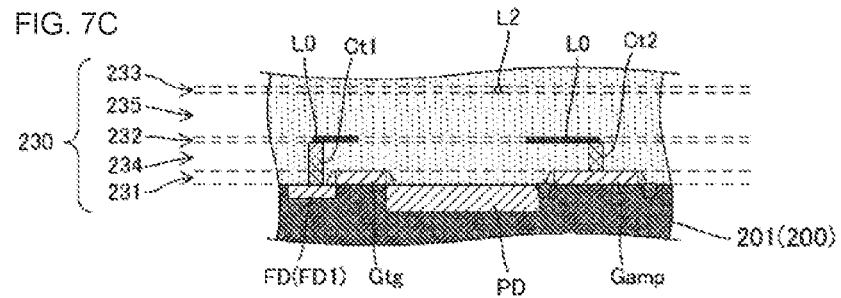

FIGS. 7A, 7B, and 7C depict an example of adjusting the EV conversion efficiency by adjusting a width of the FD interconnect L0 for each pixel. In FIGS. 7A, 7B, and 7C, the FD interconnect L0 is wider than in the pixel structure depicted in FIGS. 5A, 5B, and 5C. Widening the FD interconnect L0 increases the FD capacitance within the pixel PX, thereby making it possible to reduce the EV conversion efficiency. Conversely, narrowing the FD interconnect L0 reduces the FD capacitance within the pixel PX, thereby making it possible to improve the EV conversion efficiency.

Figure 8A:
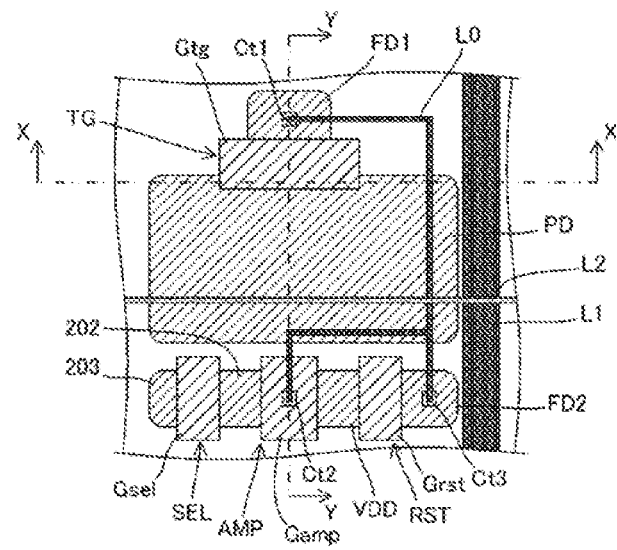
FIGS. 8A, 8B, and 8C are diagrams describing adjustment of the EV conversion efficiency made by adjusting the width of a same layer interconnect.
Figure 8B:
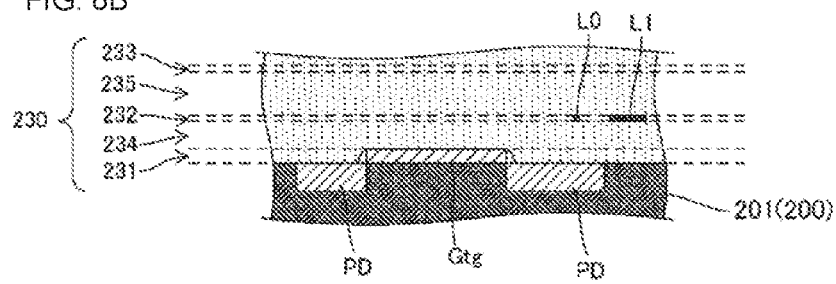
Figure 8C:
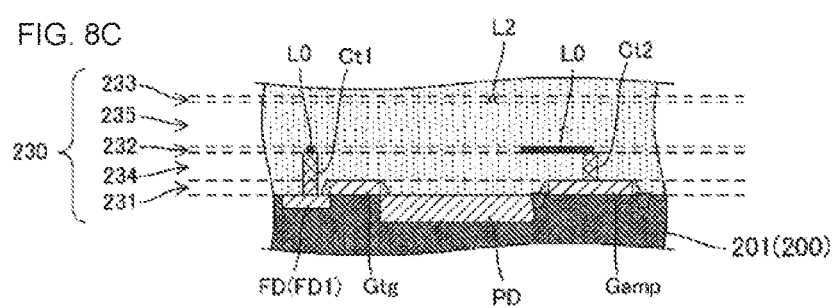

FIGS. 8A, 8B, and 8C depict an example of adjusting the EV conversion efficiency by adjusting the width of the same layer interconnect L1 for each pixel. In FIGS. 8A, 8B, and 8C, the same layer interconnect L1 is wider than in the pixel structure depicted in FIGS. 5A, 5B, and 5C. Widening the same layer interconnect L1 increases the FD capacitance within the pixel PX, thereby making it possible to reduce the EV conversion efficiency. Conversely, narrowing the same layer interconnect L1 reduces the FD capacitance within the pixel PX, thereby making it possible to improve the EV conversion efficiency.

Figure 9A:
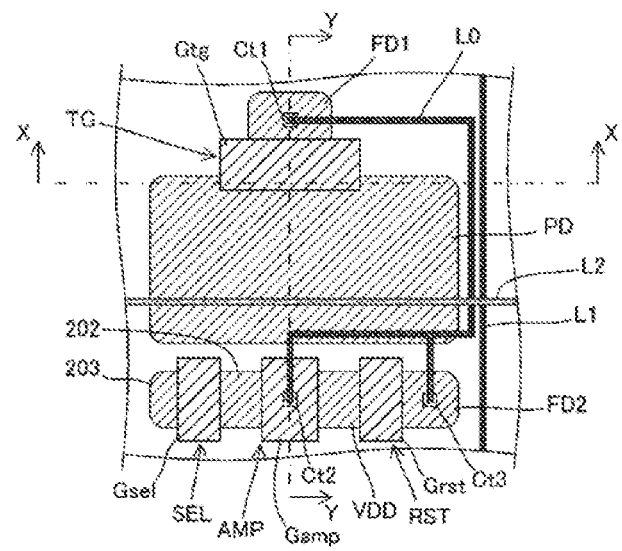
FIGS. 9A, 9B, and 9C are diagrams describing adjustment of the EV conversion efficiency made by adjusting a positional relationship between the FD interconnect and the same layer interconnect.
Figure 9B:
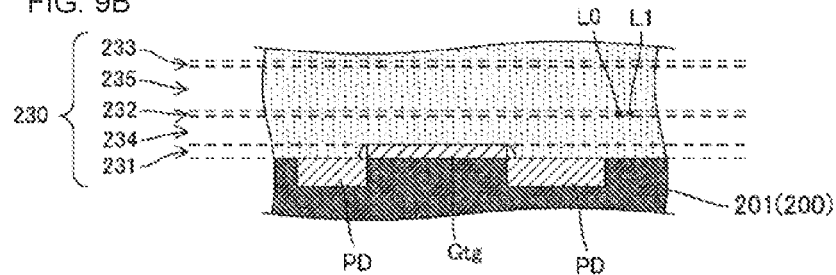
Figure 9C:
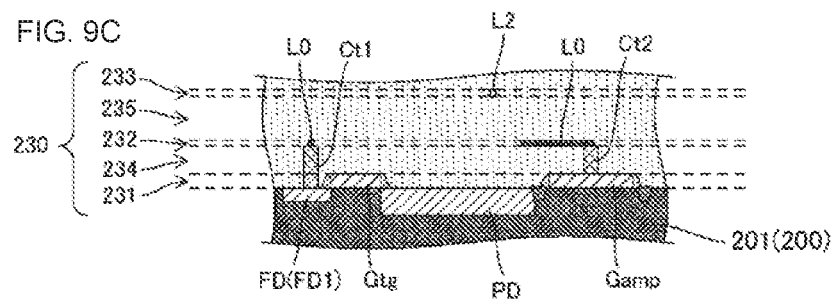

FIG. 9C depicts an example of adjusting the EV conversion efficiency by adjusting a positional relationship between the FD interconnect L0 and the same layer interconnect L1 for each pixel. In FIGS. 9A, 9B, and 9C, the FD interconnect L0 and the same layer interconnect L1 are closer to each other than in the pixel structure depicted in FIGS. 5A, 5B, and 5C. Bringing the FD interconnect L0 and the same layer interconnect L1 closer to each other increases the FD capacitance within the pixel PX, thereby making it possible to reduce the EV conversion efficiency. Conversely, separating the FD interconnect L0 and the same layer interconnect L1 away from each other reduces the FD capacitance within the pixel PX, thereby making it possible to improve the EV conversion efficiency.

Figure 10A:
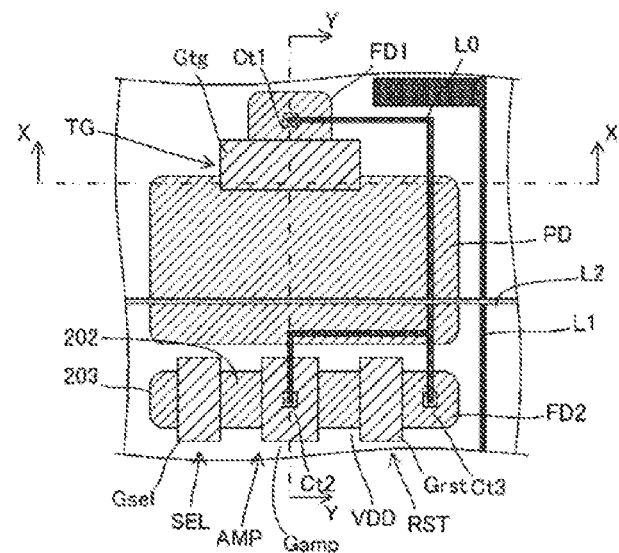
FIGS. 10A, 10B, and 10C are diagrams describing adjustment of the EV conversion efficiency made by adjusting a layout of the same layer interconnect.
Figure 10B:
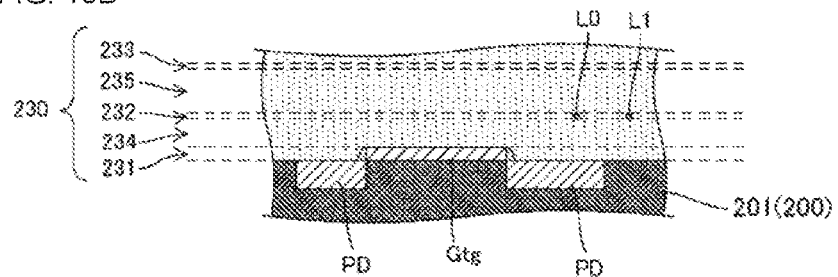
Figure 10C:
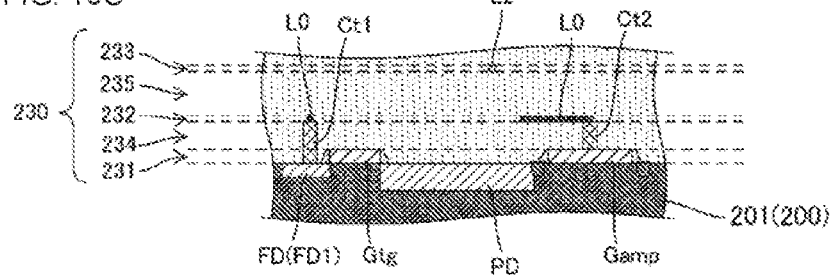

FIGS. 10A, 10B, and 10C depict an example of adjusting the EV conversion efficiency by adjusting a layout of the same layer interconnect L1 for each pixel. In FIGS. 10A, 10B, and 10C, a branch has been added to the same layer interconnect L1 as compared to the pixel structure depicted in FIGS. 5A, 5B, and 5C. Adding a branch to the same layer interconnect L1 increases the FD capacitance within the pixel PX, thereby making it possible to reduce the EV conversion efficiency.

Figure 11A:
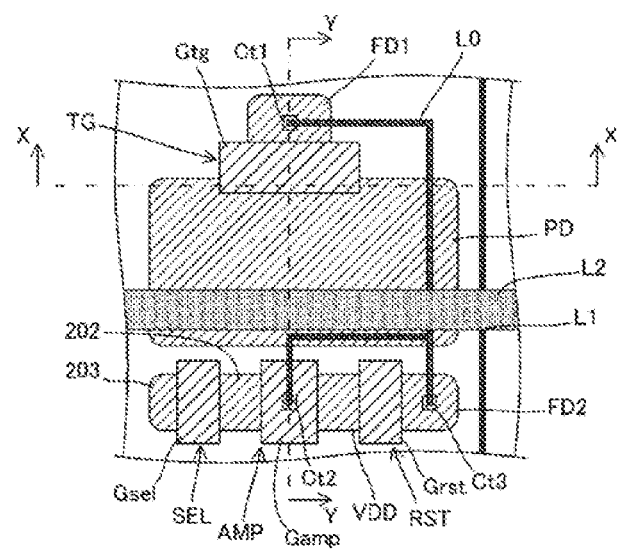
FIGS. 11A, 11B, and 11C are diagrams describing adjustment of the EV conversion efficiency made by adjusting the width of a different layer interconnect.
Figure 11B:
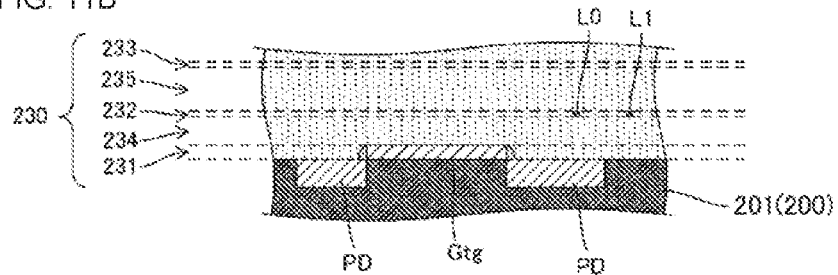
Figure 11C:
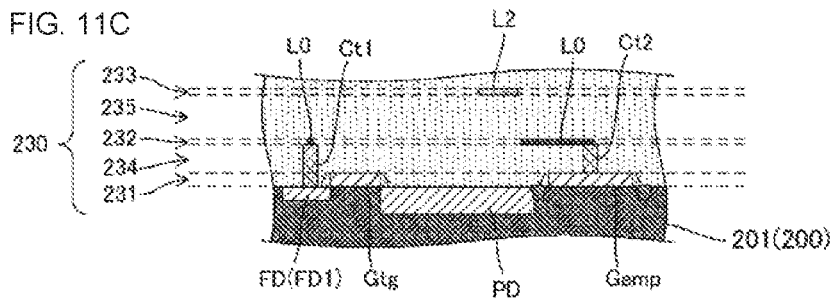

FIGS. 11A, 11B, and 11C depict an example of adjusting the EV conversion efficiency by adjusting the width of the different layer interconnect L2 for each pixel. In FIGS. 11A, 11B, and 11C, the different layer interconnect L2 is wider than in the pixel structure depicted in FIGS. 5A, 5B, and 5C. Widening the different layer interconnect L2 increases the FD capacitance within the pixel PX, thereby making it possible to reduce the EV conversion efficiency. Conversely, narrowing the different layer interconnect L2 reduces the FD capacitance within the pixel PX, thereby making it possible to improve the EV conversion efficiency.

Figure 12A:
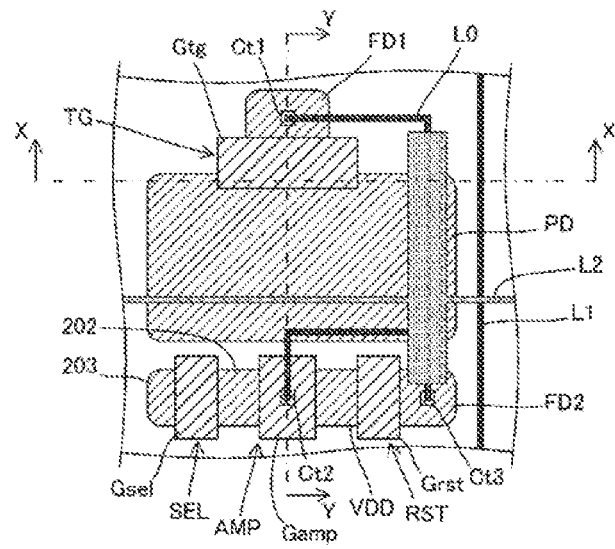
FIGS. 12A, 12B, and 12C are diagrams describing adjustment of the EV conversion efficiency made by adjusting the layout of the different layer interconnect.
Figure 12B:
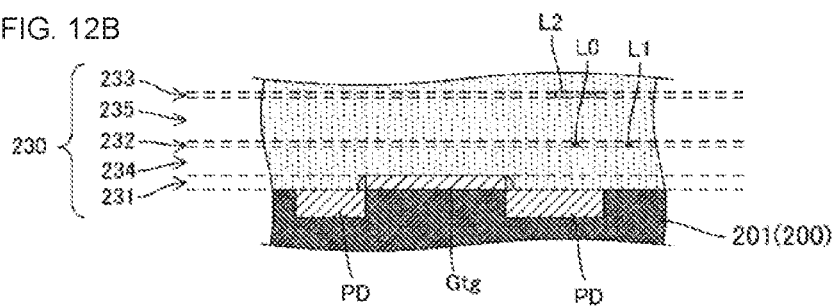
Figure 12C:
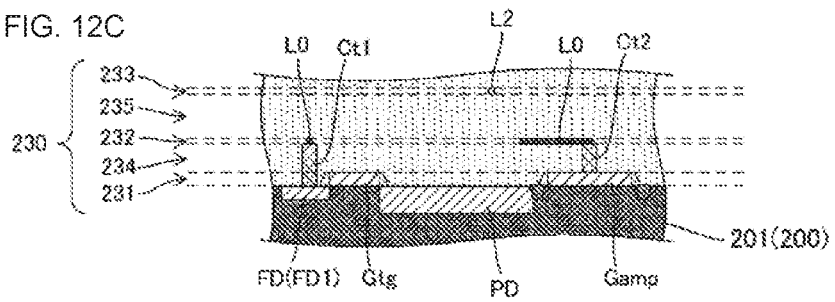

FIGS. 12A, 12B, and 12C depict an example of adjusting the EV conversion efficiency by adjusting the layout of the different layer interconnect L2 for each pixel. In FIGS. 12A, 12B, and 12C, a branch has been added to the different layer interconnect L2 as compared to the pixel structure depicted in FIGS. 5A, 5B, and 5C. Adding a branch to different layer interconnect L2 increases the FD capacitance within the pixel PX, thereby making it possible to reduce the EV conversion efficiency.

Figure 13A:
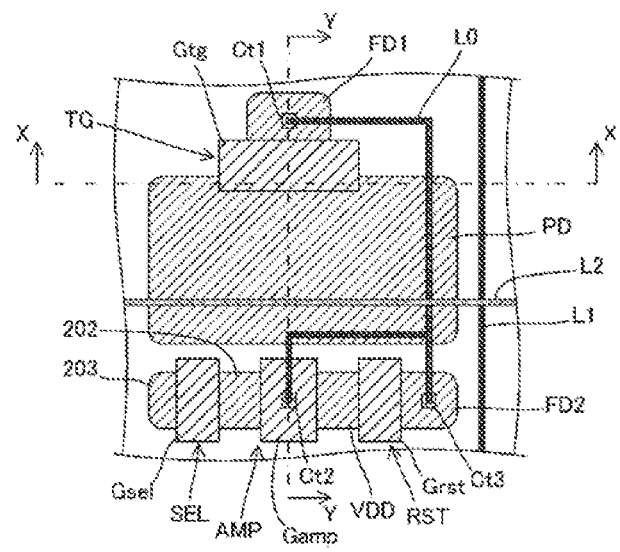
FIGS. 13A, 13B, and 13C are diagrams describing adjustment of the EV conversion efficiency made by moving the FD interconnect to other layer.
Figure 13B:
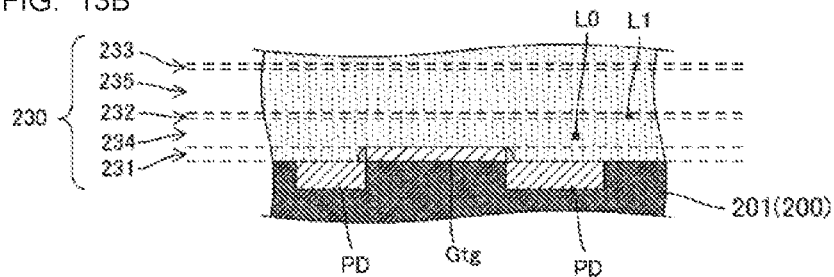
Figure 13C:
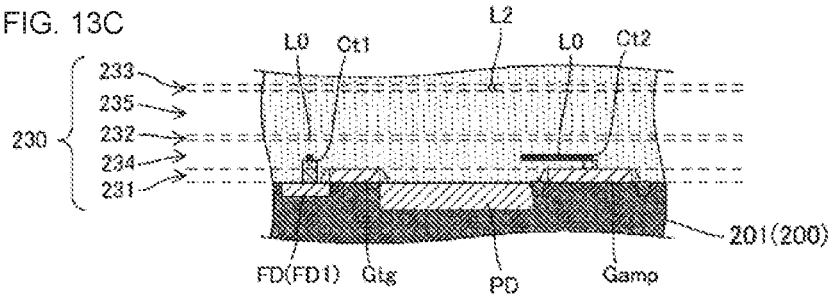

FIGS. 13A, 13B, and 13C depict an example of adjusting the EV conversion efficiency for a pixel whose EV conversion efficiency requires adjustment, by moving the FD interconnect L0 to a different layer having a lower interconnect density. In FIGS. 13A, 13B, and 13C, the FD interconnect L0 has been moved and formed in a layer having a lower interconnect density (layer closer to the semiconductor substrate 200) than the layer in which the FD interconnect L0 is formed in the pixel structure depicted in FIGS. 5A, 5B, and 5C. Moving and forming the FD interconnect L0 in a layer having a lower interconnect density reduces the FD capacity within the pixel PX, thereby making it possible to improve the EV conversion efficiency. Conversely, moving and forming the FD interconnect L0 in a layer having a higher interconnect density increases the FD capacity within the pixel PX, thereby making it possible to reduce the EV conversion efficiency.

Figure 14A:
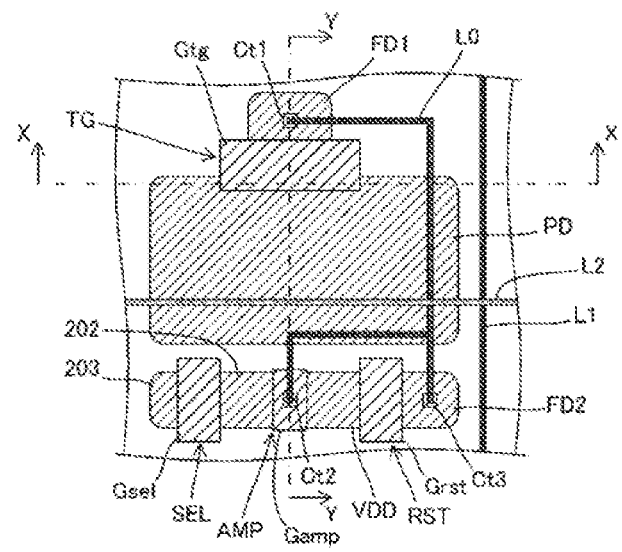
FIGS. 14A, 14B, and 14C are diagrams describing adjustment of the EV conversion efficiency made by adjusting an amplifying transistor size.
Figure 14B:
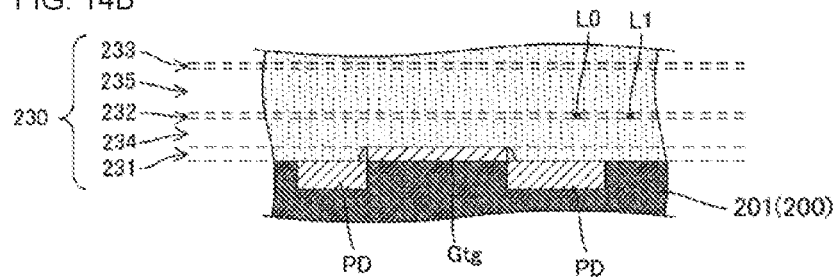
Figure 14C:
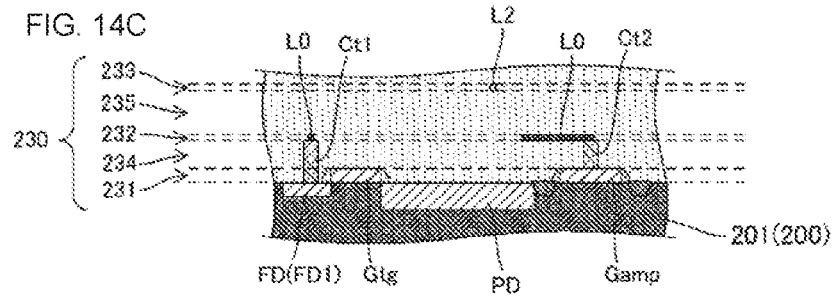

FIGS. 14A, 14B, and 14C depict an example of adjusting the EV conversion efficiency by adjusting the size of the amplifying transistor AMP (size of the amplifying gate electrode Gamp) for each pixel. In FIGS. 14A, 14B, and 14C, the size of the amplifying transistor AMP (size of the amplifying gate electrode Gamp) is smaller than in the pixel structure depicted in FIGS. 5A, 5B, and 5C. Reducing the size of the amplifying transistor AMP (size of the amplifying gate electrode Gamp) reduces the capacitance between the select transistor SEL and the amplifying transistor AMP, thereby reducing the capacitance between the reset transistor RST and the amplifying transistor AMP. This reduces the capacitance between the amplifying transistor AMP and other node interconnects, thereby reducing the FD capacitance within the pixel PX and making it possible to improve the EV conversion efficiency. Conversely, increasing the size of the amplifying transistor AMP (size of the amplifying gate electrode Gamp) increases the FD capacitance within the pixel PX, thereby making it possible to reduce the EV conversion efficiency.

Figure 15A:
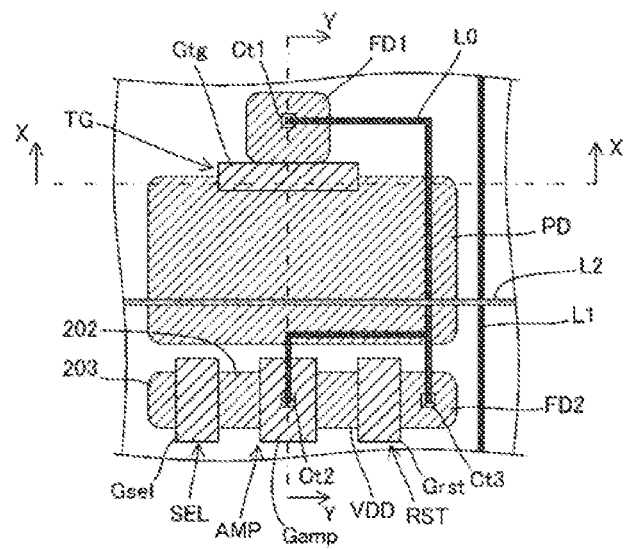
FIGS. 15A, 15B, and 15C are diagrams describing adjustment of the EV conversion efficiency made by adjusting a transfer gate electrode size.
Figure 15B:
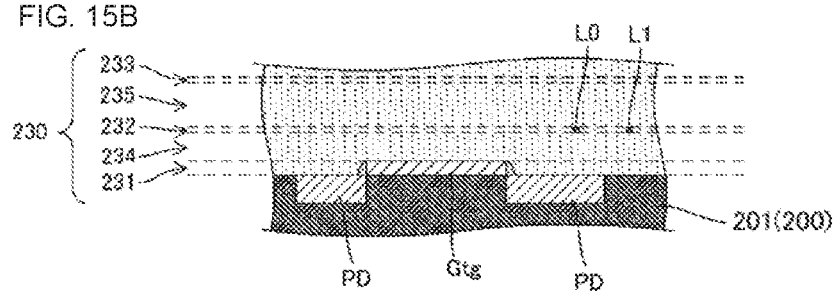
Figure 15C:
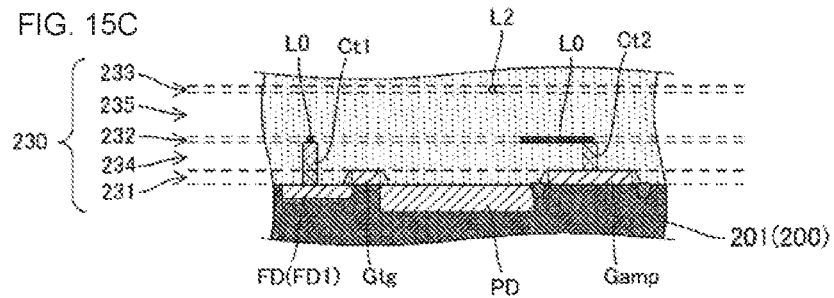

FIGS. 15A, 15B, and 15C depict an example of adjusting the EV conversion efficiency by adjusting the size of the transfer gate electrode Gtg for each pixel. In FIGS. 15A, 15B, and 15C, the size of the transfer gate electrode Gtg (the width in the direction of filling a gap between the photodiode PD and the floating diffusion FD) has been reduced as compared to the pixel structure depicted in FIGS. 5A, 5B, and 5C. In this example, reducing the size of the transfer gate electrode Gtg increases the area of the first region FD1 of the floating diffusion FD, thereby increasing FD diffusion capacitance and making it possible to reduce the EV conversion efficiency. Conversely, increasing the size of the transfer gate electrode Gtg reduces the area of the first region FD1 of the floating diffusion FD, thereby reducing the FD diffusion capacitance and making it possible to improve the EV conversion efficiency.

Figure 16A:
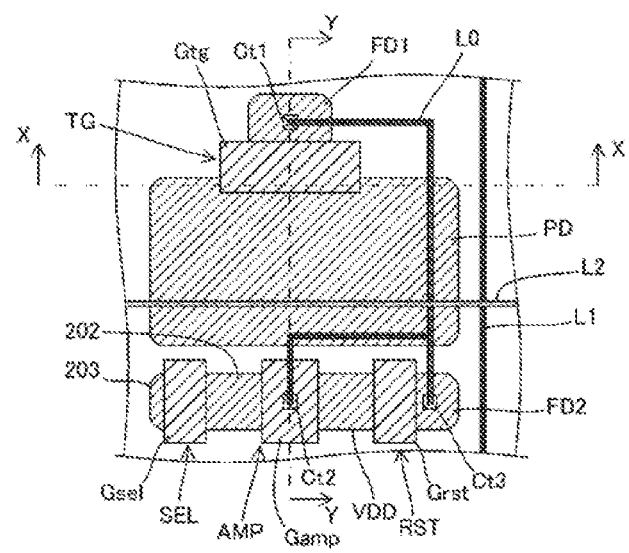
FIGS. 16A, 16B, and 16C are diagrams describing adjustment of the EV conversion efficiency made by adjusting positions of a reset transistor and a select transistor.
Figure 16B:
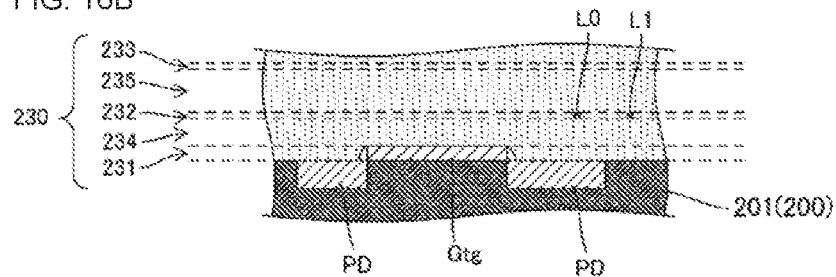
Figure 16C:
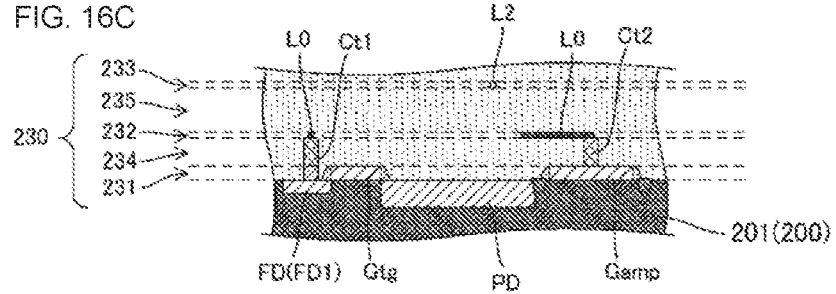

FIGS. 16A, 16B, and 16C depict an example of adjusting the EV conversion efficiency by adjusting positions of the reset transistor RST and the select transistor SEL for each pixel. In FIGS. 16A, 16B, and 16C, the positions of the reset transistor RST and the select transistor SEL have been changed so as to increase the distances to the amplifying transistor AMP as compared to the pixel structure depicted in FIGS. 5A, 5B, and 5C. Larger distances between the amplifying transistor AMP and the reset transistor RST and the select transistor SEL reduce the FD capacitance within the pixel PX, thereby making it possible to improve the EV conversion efficiency. Conversely, smaller distances between the amplifying transistor AMP and the reset transistor RST and the select transistor SEL increase the FD capacitance within the pixel PX, thereby making it possible to reduce the EV conversion efficiency.

Figure 17A:
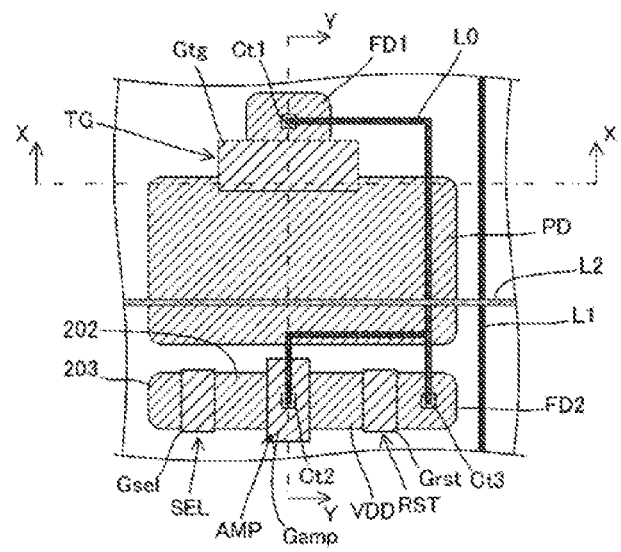
FIGS. 17A, 17B, and 17C are diagrams describing adjustment of the EV conversion efficiency made by adjusting the sizes of a reset gate electrode and a select gate electrode.
Figure 17B:
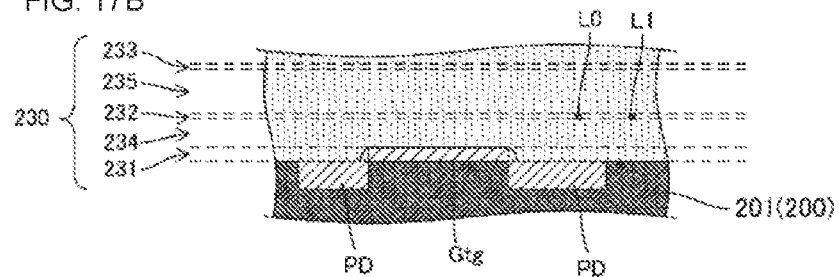
Figure 17C:
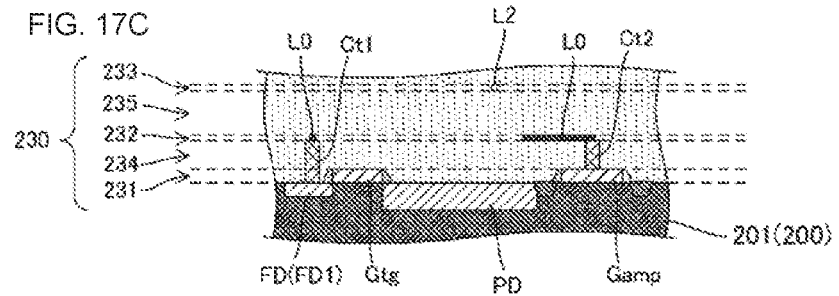

FIGS. 17A, 17B, and 17C depict an example of adjusting the EV conversion efficiency by adjusting the sizes of the reset gate electrode Grst and the select gate electrode Gsel for each pixel. In FIGS. 17A, 17B, and 17C, the sizes of the reset gate electrode Grst and the select gate electrode Gsel have been reduced (in particular, the distances to the amplifying transistor AMP have been increased) as compared to the pixel structure depicted in FIGS. 5A, 5B, and 5C. Reducing the sizes of the reset gate electrode Grst and the select gate electrode Gsel reduces the FD capacitance within the pixel PX, thereby making it possible to improve the EV conversion efficiency. Conversely, increasing the sizes of the reset gate electrode Grst and the select gate electrode Gsel increases the FD capacitance within the pixel PX, thereby making it possible to reduce the EV conversion efficiency.

Figure 18A:
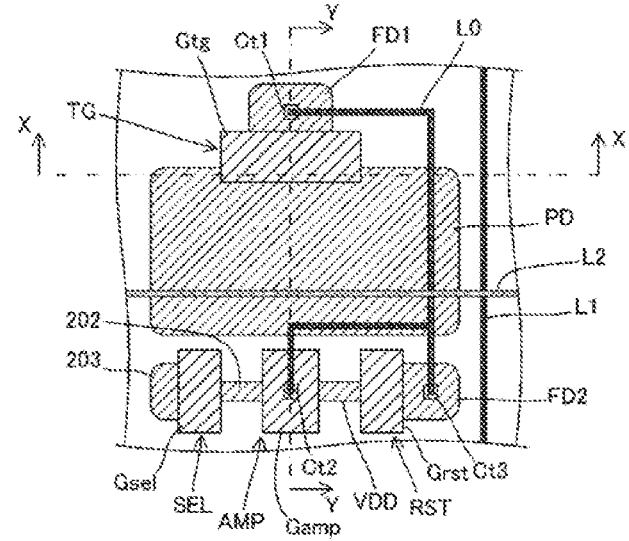
FIGS. 18A, 18B, and 18C are diagrams describing adjustment of the EV conversion efficiency made by adjusting a channel size of the amplifying transistor.
Figure 18B:
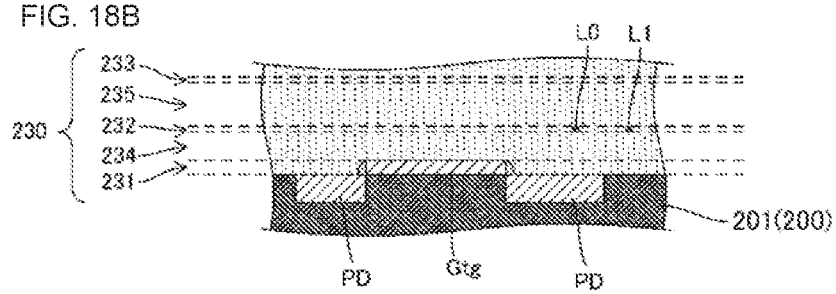
Figure 18C:
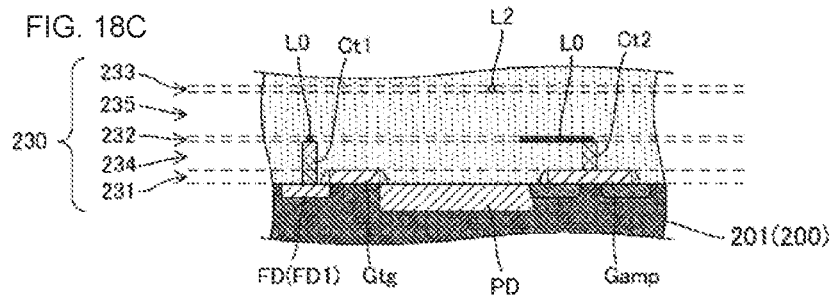

FIGS. 18A, 18B, and 18C depict an example of adjusting the EV conversion efficiency by adjusting a channel size (length W) of the amplifying transistor AMP for each pixel. In FIGS. 18A, 18B, and 18C, the channel size of the amplifying transistor AMP has been reduced as compared to the pixel structure depicted in FIGS. 5A, 5B, and 5C. Reducing the channel size of the amplifying transistor AMP reduces the FD capacitance within the pixel PX, thereby making it possible to improve the EV conversion efficiency. Conversely, increasing the channel size of the amplifying transistor AMP increases the FD capacitance within the pixel PX, thereby making it possible to reduce the EV conversion efficiency.

Figure 19A:
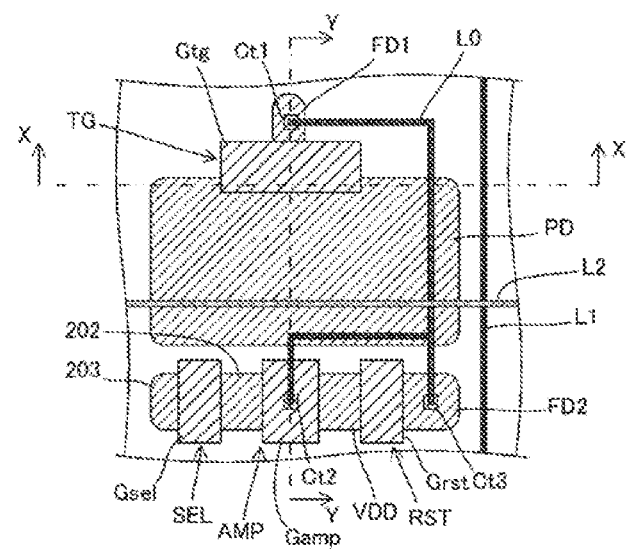
FIGS. 19A, 19B, and 19C are diagrams describing adjustment of the EV conversion efficiency made by adjusting the size of a first region of a floating diffusion.
Figure 19B:
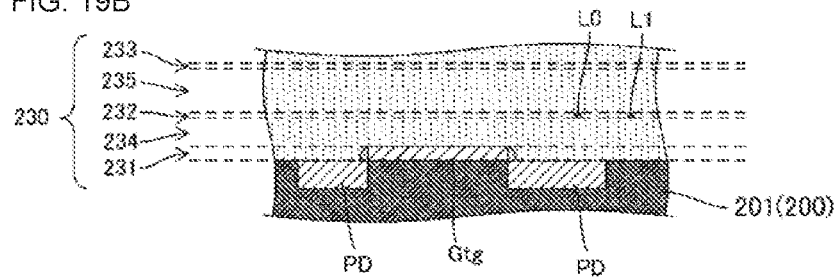
Figure 19C:
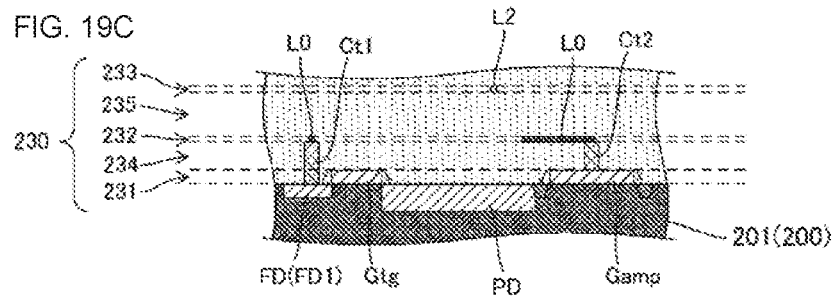

FIGS. 19A, 19B, and 19C depict an example of adjusting the EV conversion efficiency by adjusting the size of the first region FD1 of the floating diffusion FD for each pixel. In FIGS. 19A, 19B, and 19C, the size of the first region FD1 has been reduced as compared to the pixel structure depicted in FIGS. 5A, 5B, and 5C. Reducing the size of the first region FD1 reduces the FD capacitance within the pixel PX, thereby making it possible to improve the EV conversion efficiency. Conversely, increasing the size of the first region FD1 increases the FD capacitance within the pixel PX, thereby making it possible to reduce the EV conversion efficiency.

Figure 20A:
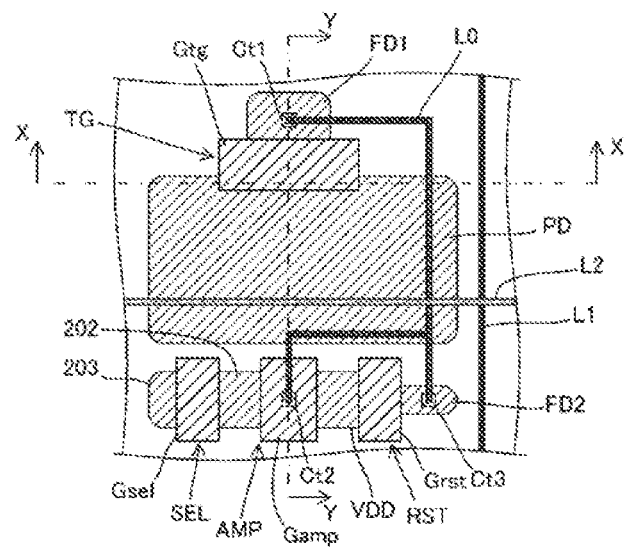
FIGS. 20A, 20B, and 20C are diagrams describing adjustment of the EV conversion efficiency made by adjusting the size of a second region of the floating diffusion FD.
Figure 20B:
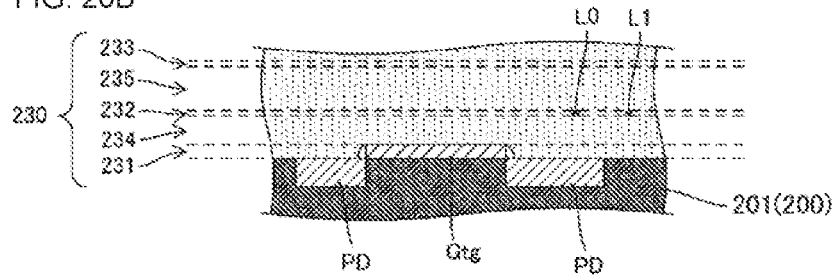
Figure 20C:
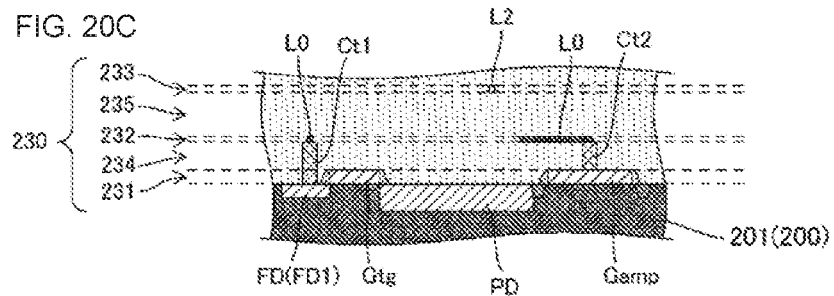

FIGS. 20A, 20B, and 20C depict an example of adjusting of the EV conversion efficiency by adjusting the size of the second region FD2 of the floating diffusion FD for each pixel. In FIGS. 20A, 20B, and 20C, the size of the second region FD2 has been reduced as compared to the pixel structure depicted in FIGS. 5A, 5B, and 5C. Reducing the size of the second region FD2 reduces the FD capacitance within the pixel PX, thereby making it possible to improve the EV conversion efficiency. Conversely, increasing the size of the second region FD2 increases the FD capacitance within the pixel PX, thereby making it possible to reduce the EV conversion efficiency.

Figure 21A:
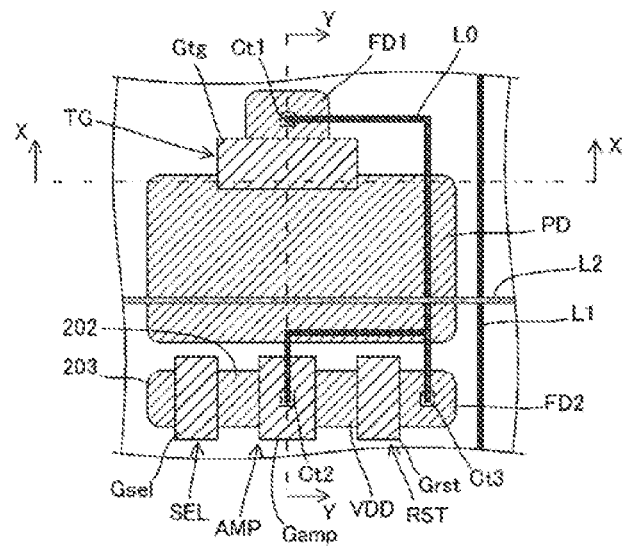
Figure 21A:
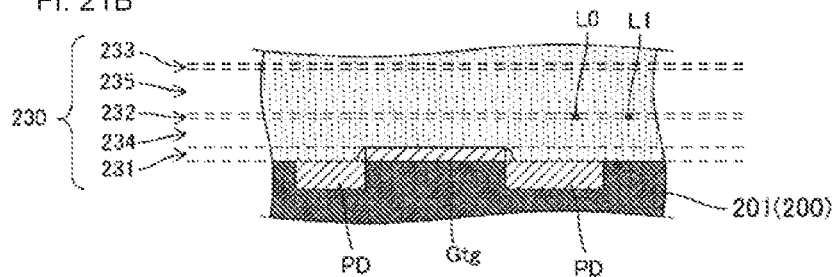
Figure 21C:
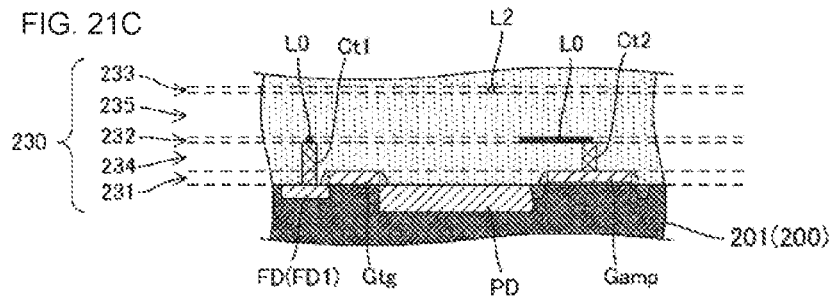

FIGS. 21A, 21B, and 21C depict an example of adjusting the EV conversion efficiency by adjusting a thickness of a gate insulating film of the amplifying transistor AMP for each pixel. In FIGS. 21A, 21B, and 21C, the gate insulating film of the amplifying transistor AMP has been formed thicker than in the pixel structure depicted in FIGS. 5A, 5B, and 5C. Thickening the gate insulating film of the amplifying transistor AMP reduces the FD capacitance within the pixel PX, thereby making it possible to improve the EV conversion efficiency. Conversely, thinning the gate insulating film of the amplifying transistor AMP increases the FD capacitance within the pixel PX, thereby making it possible to reduce the EV conversion efficiency.

In addition to the above, it is possible to adjust the EV conversion efficiency for each pixel by adjusting the concentration of the N-type impurity of the floating diffusion FD formed as an N-type semiconductor region with high impurity concentration. For example, the concentration of the N-type impurity of the floating diffusion FD is reduced as compared to the pixel structure depicted in FIGS. 5A, 5B, and 5C. Reducing the concentration of the N-type impurity of the floating diffusion FD reduces the diffusion capacitance of the floating diffusion FD, thereby making it possible to improve the EV conversion efficiency of the pixel PX. Conversely, reducing the concentration of the N-type impurity of the floating diffusion FD reduces a conductivity (characteristic) of the floating diffusion FD, thereby making it possible to reduce the EV conversion efficiency of the pixel PX.

As described above, it is possible to adjust the EV conversion efficiency by adjusting the structure or characteristic of at least one of the transfer transistor TG, the reset transistor RST, the amplifying transistor AMP, the select transistor SEL, the floating diffusion FD, or the metal interconnects included in the pixel PX. It should be noted that the structures and characteristics depicted in FIGS. 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 140, 15A, 14B, 140, 15A, 15B, 150, 16A, 16B, 160, 17A, 17B, 170, 18A, 18B, 180, 19A, 19B, 19C, 20A, 20B, 20C, 21A, 21B, and 21C are merely examples, that the structural adjustments depicted in FIGS. 7A, 7B, 7C, 8A, 8B, 8C, 9A, 9B, 9C, 10A, 10B, 10C, 11A, 11B, 11C, 12A, 12B, 12C, 13A, 13B, 13C, 14A, 14B, 14C, 15A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, and 21C may be carried out in combination, and that other structural and characteristic adjustments for varying the EV conversion efficiency of the pixel PX may also be used.

(2) Second Embodiment

Figure 22:
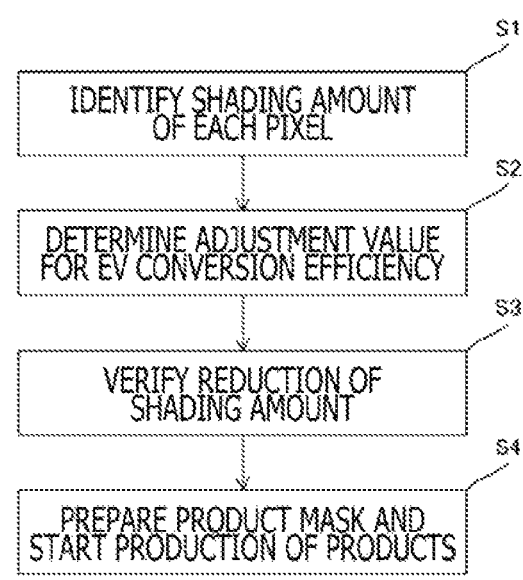
FIG. 22 is a diagram depicting a schematic flow of a manufacturing method of the solid-state imaging element.

A description will be given next of a manufacturing method of the solid-state imaging element 100 described above. FIG. 22 is a diagram depicting a schematic flow of the manufacturing method of the solid-state imaging element 100. The present embodiment is carried out as a pre-process of the actual processes for manufacturing the solid-state imaging element 100, and a description will be given of a flow for adjusting the EV conversion efficiency for each pixel.

First, shading amount is identified for each pixel of the solid-state imaging element 100 whose EV conversion efficiency is to be adjusted (S1). The shading amount may be identified by preparing a test module and making measurements or by simulation. This measurement of the shading amount requires identification of the lens characteristic for condensing incident light on the solid-state imaging element 100 and the characteristic of an optical filter such as optical film. That is, if an incidence angle of incident light falling on each pixel and a spectral distribution are found, it is possible to identify the shading amount before adjusting the EV conversion efficiency.

Next, an adjustment amount of the EV conversion efficiency is determined for each pixel on the basis of the shading amount identified (S2). The extents to which the EV conversion efficiency is adjusted by the respective adjustments of the pixel structures described above are identified in advance by measurements or simulation. Therefore, as long as the adjustment amount of the EV conversion efficiency to be applied to each pixel is determined, it is possible to predict which structure or characteristic to adjust in order to achieve a desired EV conversion efficiency.

Next, the reduction in shading amount is verified by measurement of the reduction in shading amount using a test module to which the structural or characteristic adjustment predicted to be required for each pixel has been applied or by simulation to which the structural or characteristic adjustment predicted to be required for each pixel has been applied (S3). In the case where the adjustment of the shading amount is insufficient, the adjustment amount of the EV conversion efficiency is adjusted again (S2), and the reduction in shading amount is verified again (S3). Thereafter, the processes in steps S2 and S3 are repeated until the target adjustment amount of the shading amount is reached.

Thereafter, a product mask for use in each manufacturing process of the solid-state imaging element 100 is prepared, and the solid-state imaging element 100 is actually manufactured by using the mask (S4). The pixel structure for realizing the EV conversion efficiency set in step S2 has been reflected in the mask prepared in this manner, and, for example, the mask shape of the pixels at the center portion of the pixel region and the mask shape of the pixels at the peripheral portion are different. In the solid-state imaging element 100 manufactured in this manner, the analog voltage output from the pixel PX has already undergone shading correction, providing improved uneven brightness with no shading correction in the stages subsequent to the AD conversion section. This makes it possible to perform shading correction without sacrificing the noise characteristic and the sensitivity characteristic.

(3) Third Embodiment

Figure 23:
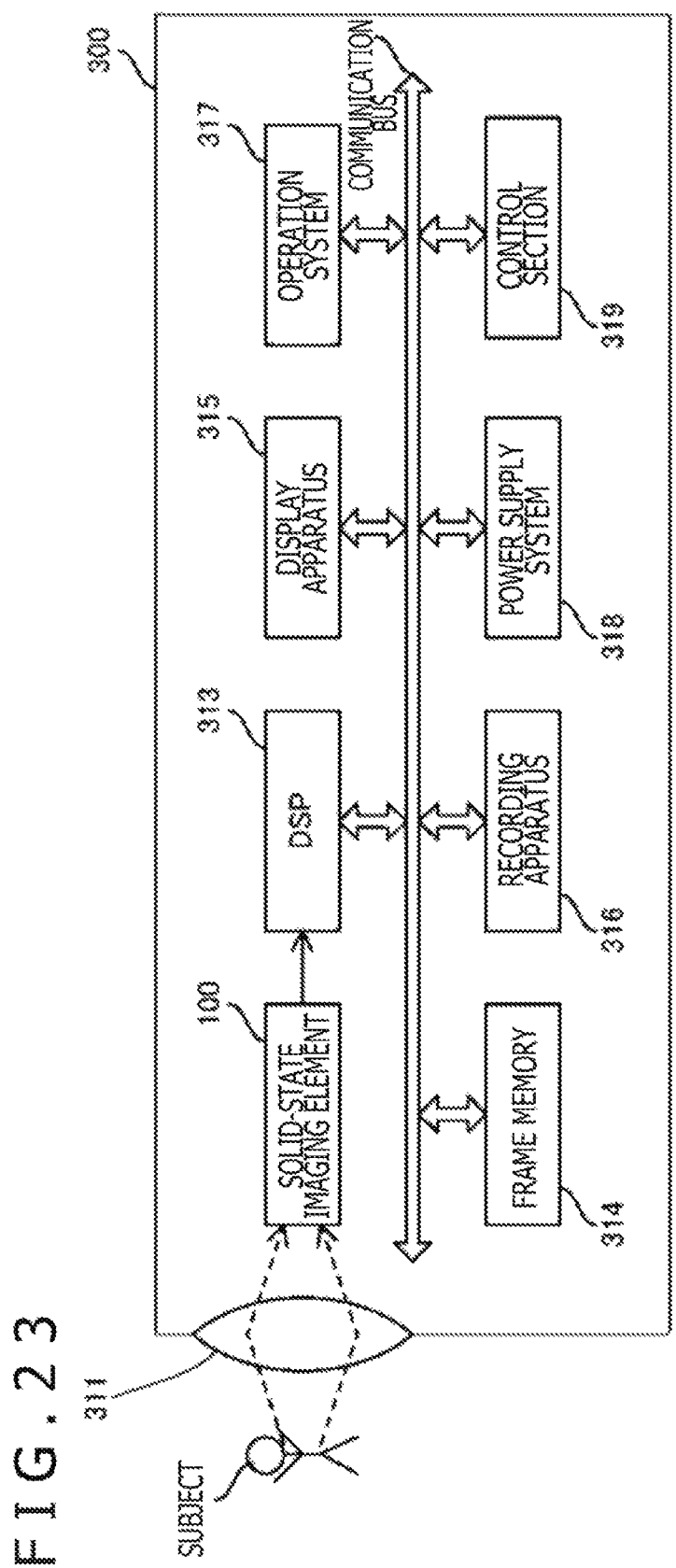
FIG. 23 is a block diagram depicting a configuration of an imaging apparatus.
Figure 24A:
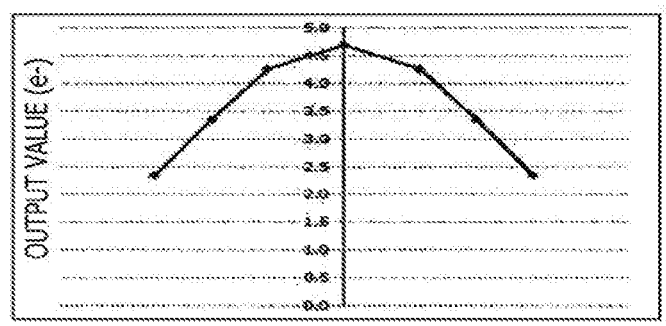
FIGS. 24A, 24B, 24C, 24D, and 24E are diagrams describing shading correction in the past.
Figure 24B:
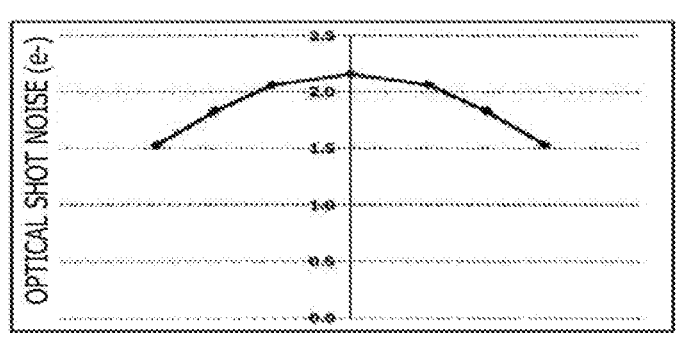
Figure 24C:
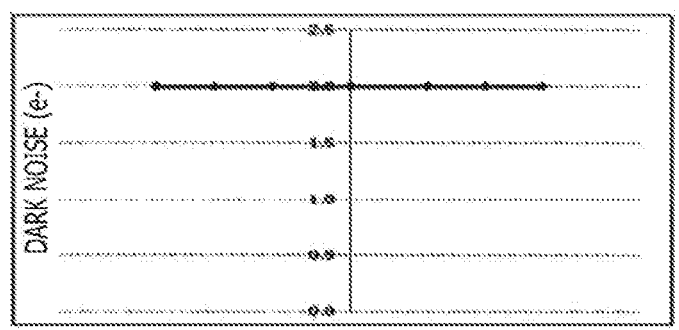
Figure 24D:
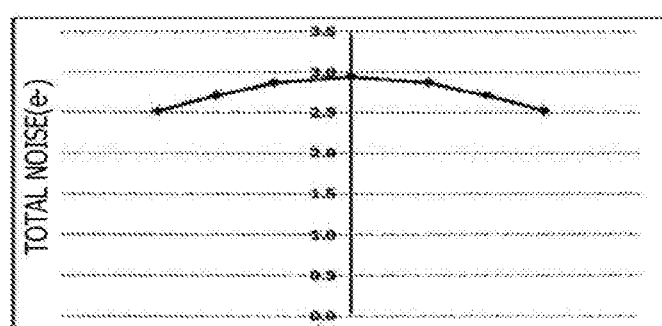
Figure 24E:
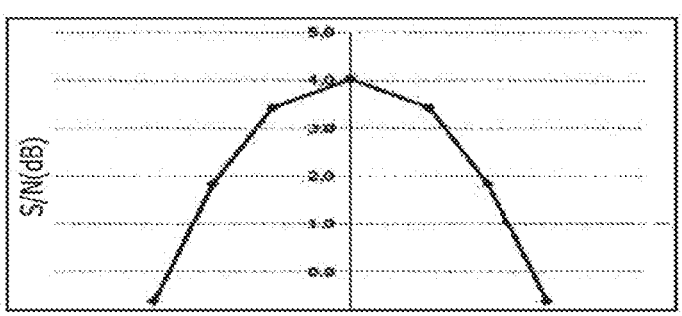

FIG. 23 is a block diagram depicting a configuration of an imaging apparatus 300 including the solid-state imaging element 100. The imaging apparatus 300 depicted in FIG. 23 is an example of electronic equipment.

It should be noted that an imaging apparatus refers to electronic equipment in general that uses a solid-state imaging apparatus for its image capture section (photoelectric conversion section) such as imaging apparatus including digital still camera and digital video camera and mobile terminal apparatus including mobile phone having an imaging function. Of course, electronic equipment using a solid-state imaging apparatus for its image capture section includes a copier that uses a solid-state imaging apparatus for its image reading section. Also, the imaging apparatus may be modular including the solid-state imaging apparatus so as to be incorporated in the above electronic equipment.

In FIG. 23, the imaging apparatus 300 includes an optics 311 including a group of lenses, the solid-state imaging element 100, a DSP 313 (Digital Signal Processor) as a signal processing circuit for processing output signals from the solid-state imaging element 100, a frame memory 314, a display apparatus 315, a recording apparatus 316, an operation system 317, a power supply system 318, and a control section 319.

The DSP 313, the frame memory 314, the display apparatus 315, the recording apparatus 316, the operation system 317, the power supply system 318, and the control section 319 are connected to each other via a communication bus to exchange data and signals.

The optics 311 captures incident light (image light) from a subject and forms an image on an imaging surface of the solid-state imaging element 100. The solid-state imaging element 100 generates, on a pixel-by-pixel basis, an electric signal proportional to the amount of incident light whose image has been formed on the imaging surface by the optics 311 and outputs the signal as a pixel signal. This pixel signal is input to the DSP 313, undergoes various types of image processing as appropriate, and is then stored in the frame memory 314, recorded in a recording media of the recording apparatus 316, or output to the display apparatus 315.

The display apparatus 315 includes a liquid crystal display apparatus, an organic EL (electro luminescence) display apparatus, or other panel display apparatus, and displays videos and still images captured by the solid-state imaging element 100 and other information. The recording apparatus 316 records videos and still images captured by the solid-state imaging element 100, to a recording media such as DVD (Digital Versatile disk), HD (Hard Disk), or semiconductor memory.

The operation system 317 accepts a variety of operations from a user and sends an operation instruction corresponding to the user operation to the respective sections 313, 314, 315, 316, 318, and 319 via a communication bus. The power supply system 318 generates various supply voltages that will be used as driving power supplies and supplies these voltages to supply targets (respective sections 312, 313, 314, 315, 316, 317, and 319) as appropriate.

The control section 319 includes a CPU for performing arithmetic operations, a ROM for storing a control program of the imaging apparatus 300, a RAM that functions as a CPU's work area, and so on. The CPU executes the control program stored in the ROM while at the same time using the RAM as a work area, allowing the control section 319 to control the respective sections 313, 314, 315, 316, 317, and 318 via the communication bus. Also, the control section 319 causes a timing generator, not depicted, to generate a variety of timing signals by controlling the timing generator and also performs control such that the timing signals are supplied to the respective sections.

(4) Application Example to Endoscopic Surgery System

The technology according to the present disclosure (the present technology) is applicable to a variety of products. For example, the technology according to the present disclosure may be applied to an endoscopic surgery system.

Figure 25:
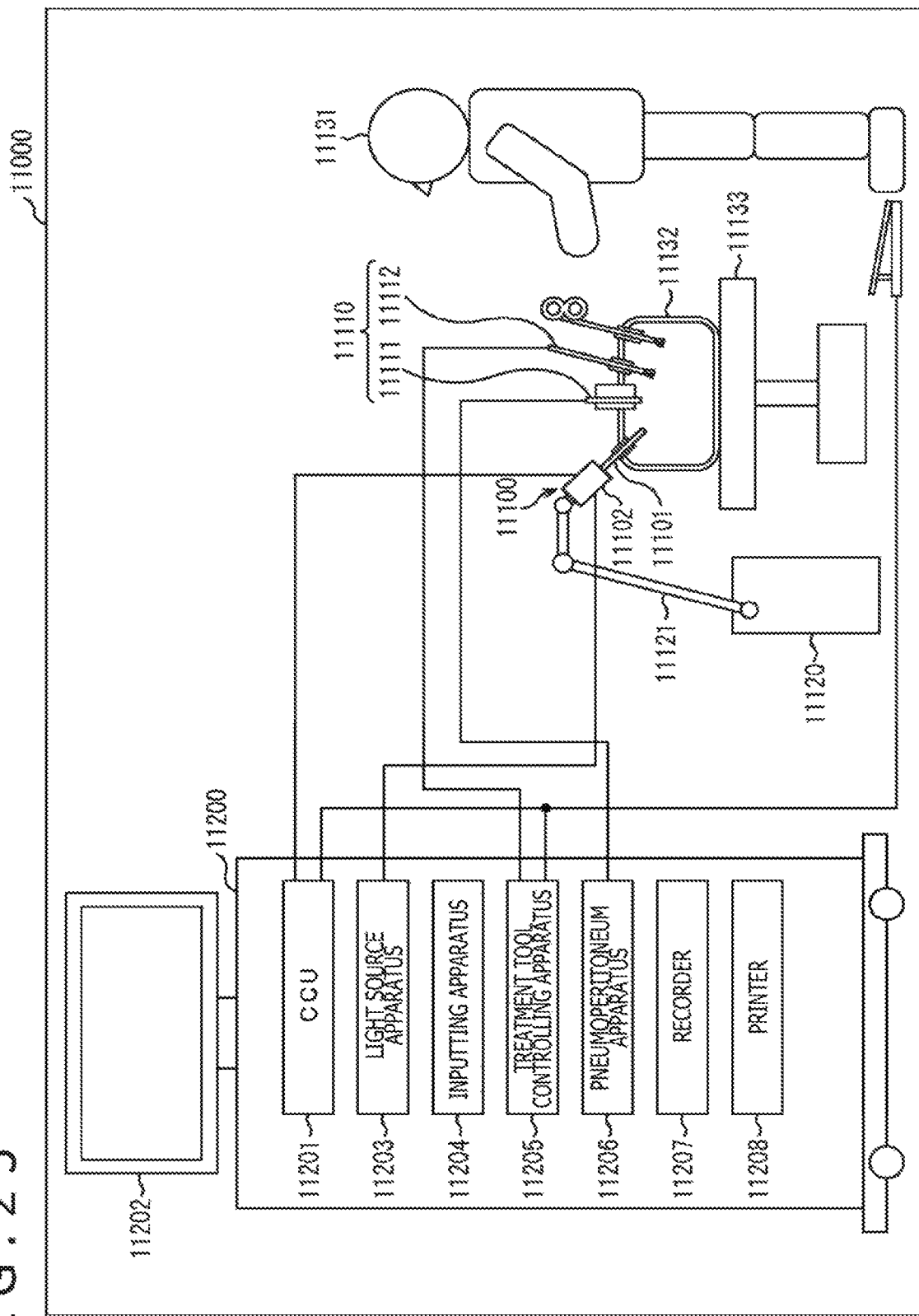
FIG. 25 is a view depicting an example of a schematic configuration of an endoscopic surgery system.

FIG. 25 is a view depicting an example of a schematic configuration of an endoscopic surgery system to which the technology according to an embodiment of the present disclosure (present technology) can be applied.

In FIG. 25, a state is depicted in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 26:
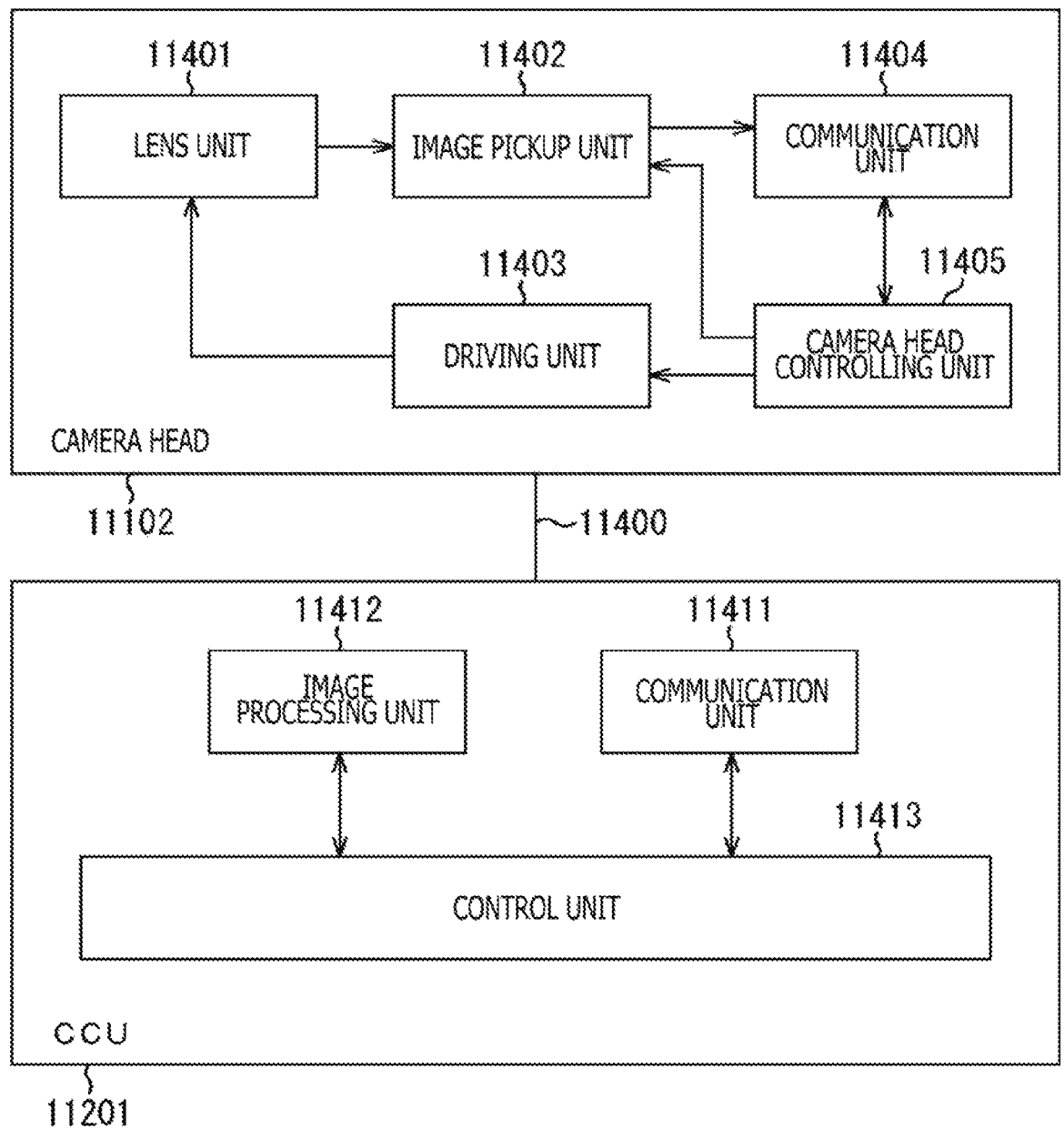
FIG. 26 is a block diagram depicting an example of functional configurations of a camera head and a CCU.

FIG. 26 is a block diagram depicting an example of a functional configuration of the camera head 11102 and the CCU 11201 depicted in FIG. 25.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit

11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes image pickup elements. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

A description has been given above of an example of an endoscopic surgery system to which the technology according to the present disclosure is applicable. The technology according to the present disclosure is applicable, of the components described above, to the image pickup unit 11402 of the camera head 11102. Specifically, the solid-state imaging element 100 depicted in FIG. 1 is applicable to the image pickup unit 10402. Shading correction can be performed without sacrificing the noise characteristic and the sensitivity characteristic by applying the technology according to the present technology to the image pickup unit 10402. This provides clearer surgery site images, allowing a surgeon to positively confirm a surgery site.

It should be noted that although an endoscopic surgery system has been described here as an example, the technology according to the present disclosure may be additionally applied, for example, to a microscopic surgery system and so on.

(5) Application Example to Mobile Body

The technology according to the present disclosure (the present technology) is applicable to a variety of products. For example, the technology according to the present disclosure may be realized as an apparatus mounted on any kinds of mobile bodies such as a motor vehicle, electric vehicle, hybrid electric vehicle, motorcycle, bicycle, personal mobility, airplane, drone, ship, or robot.

Figure 27:
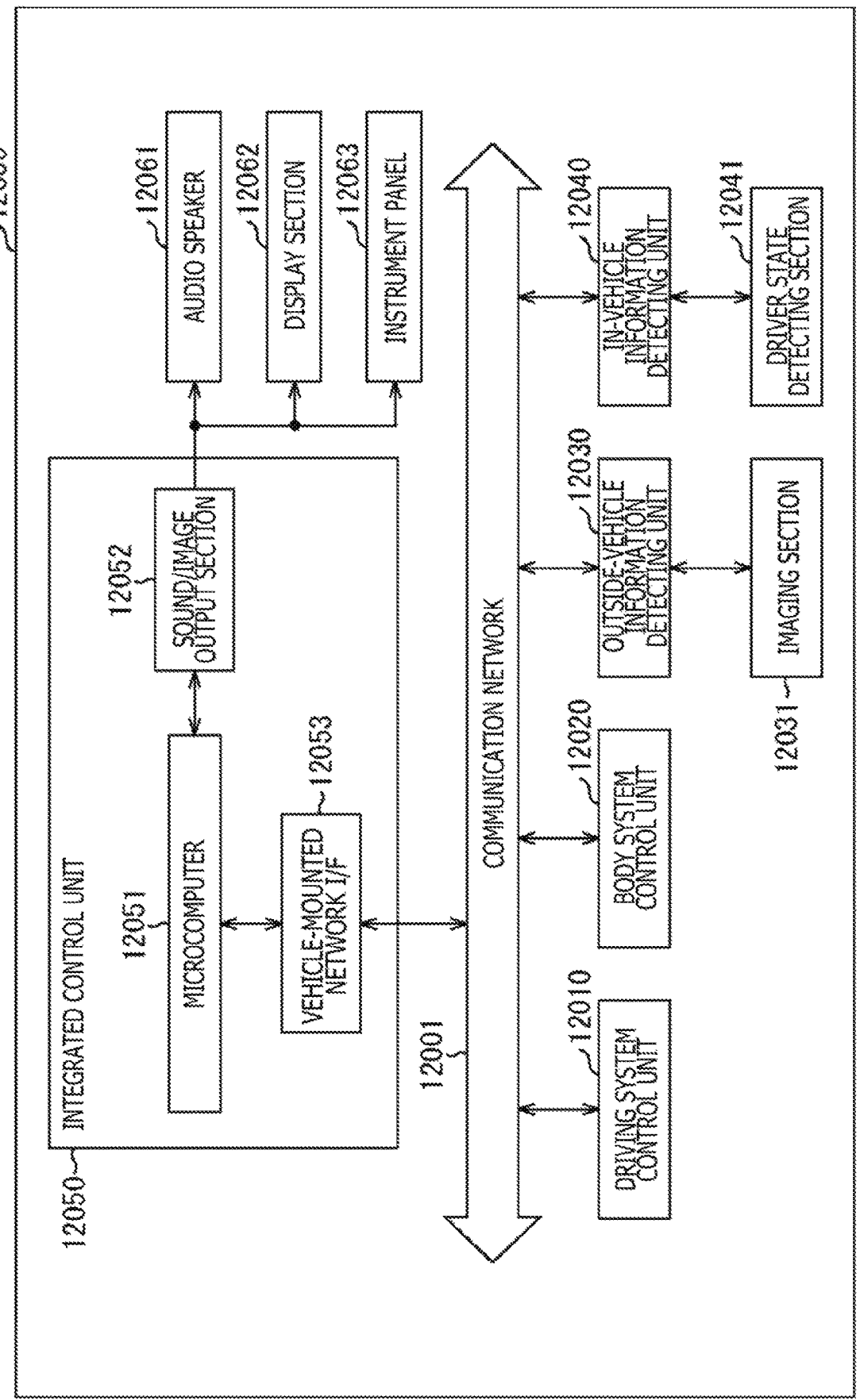
FIG. 27 is a block diagram depicting an example of schematic configuration of a vehicle control system.

FIG. 27 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 27, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are depicted as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 27, an audio speaker 12061, a display section 12062, and an instrument panel 12063 are depicted as the output device. The display section 12062 may, for example, include at least one of an on-board display and a head-up display.

Figure 28:
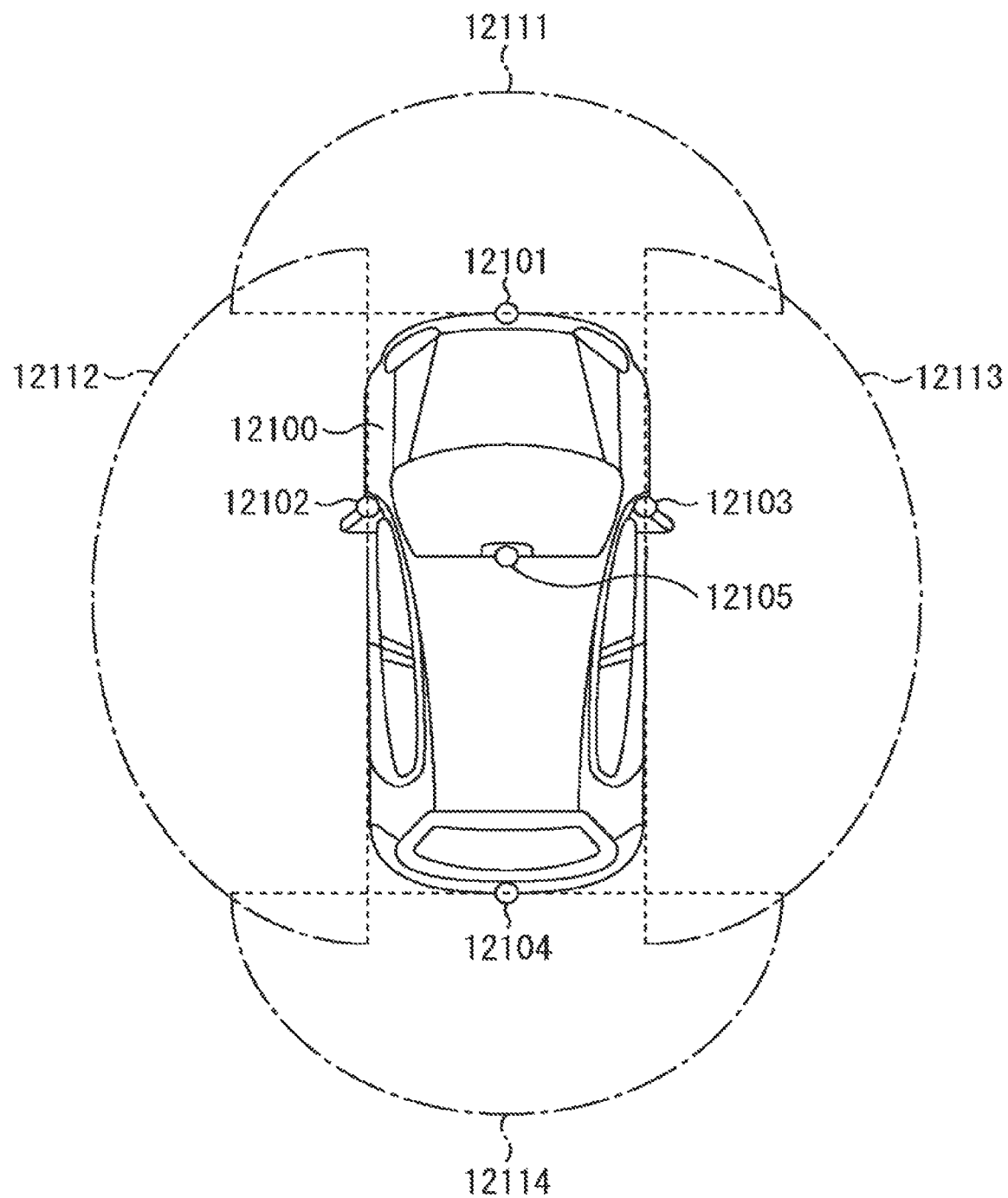
FIG. 28 is a diagram of assistance in explaining an example of installation positions of an outside-vehicle information detecting section and an imaging section.

FIG. 28 is a diagram depicting an example of the installation position of the imaging section 12031.

In FIG. 28, the imaging section 12100 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging section 12101 and imaging section 12105 are used mainly to detect a preceding vehicle, a pedestrian, an obstacle, a signal, a traffic sign, a lane, or the like.

Incidentally, FIG. 28 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

A description has been given above of an example of a vehicle control system to which the technology according to the present disclosure is applicable. The technology according to the present disclosure is applicable, of the components described above, to the imaging section 12031 and so on. Specifically, the solid-state imaging element 100 depicted in FIG. 1 is applicable to the imaging section 12031 and so on. Shading correction can be performed without sacrificing the noise characteristic and the sensitivity characteristic by applying the technology according to the present technology to the imaging section 12031 and so on. This provides captured images that are easier to see, easing driver's fatigue.

It should be noted that the present technology is not limited to the above embodiments and includes configurations in which the respective components disclosed in the respective embodiments described above have been replaced with each other or the combinations thereof have been changed, configurations in which the respective components disclosed in known technologies and the respective embodiments described above have been replaced with each other, and so on. Also, the technical scope of the present technology is not limited to the above embodiments and covers the matters recited in the claims and their equivalents.

Then, the present technology can have the following configurations:

(1) A solid-state imaging element including:
    a plurality of pixels that are arranged two-dimensionally and each outputs analog voltage proportional to electron produced by photodiode, respectively; and
    an AD conversion section adapted to convert analog voltages output from the pixels into digital signals, in which first and second pixels included in the plurality of pixels differ in conversion efficiency with which a unit quantity of electrons output from the photodiodes are converted into the analog voltages.
(2) The solid-state imaging element of feature (1), in which the pixel located at a center portion and the pixel located at a peripheral portion among the pixels arranged two-dimensionally differ in the conversion efficiency.
(3) The solid-state imaging element of feature (1) or (2), in which
the first and second pixels differ in structure of at least one of transistor elements, a floating diffusion, or metal interconnects included in the pixel.
(4) The solid-state imaging element of feature (3), in which the first and second pixels differ in at least shape, size, or layout of the metal interconnects.
(5) The solid-state imaging element of feature (3) or (4), in which
the first and second pixels differ in structure of the transistor element gate in terms of at least one of shape, size, or layout.
(6) The solid-state imaging element of any one of features (3) to (5), in which
the first and second pixels differ in structure of the floating diffusion in terms of at least one of shape, size, or layout.
(7) The solid-state imaging element of any one of features (3) to (6), in which
the first and second pixels differ in gate insulating film thickness of the transistor element.
(8) The solid-state imaging element of any one of features (1) to (7), in which
the first and second pixels differ in concentration of an N-type impurity in a diffusion layer included in the floating diffusion.
(9) Electronic equipment including:
a solid-state imaging element, the solid-state imaging element including:
a plurality of pixels that are arranged two-dimensionally and each outputs analog voltage proportional to electron produced by photodiode; and
an AD conversion section adapted to convert analog voltages output from the pixels into digital signals,
first and second pixels included in the plurality of pixels differing in conversion efficiency with which a unit quantity of electrons output from the photodiodes are converted into the analog voltages.

REFERENCE SIGNS LIST

100 . . . Solid-state imaging element, 111 . . . Condenser lens, 121 . . . Pixel section, 122 . . . Vertical drive section, 123 . . . AD conversion section, 123a . . . Comparator, 123b . . . Counter, 123c . . . Latch, 124 . . . Reference signal generation section, 125 . . . Horizontal drive section, 126 . . . Timing control section, 127 . . . Signal processing section, 200 . . . Semiconductor substrate, 200A . . . Front surface of the substrate, 200B . . . Back surface, 201 . . . Well region, 202 . . . Diffusion layer, 203 . . . Diffusion layer, 210 . . . Pixel region, 212 . . . Gate electrode, 213 . . . Element separation region, 214 . . . Interconnects, 215 . . . Interlayer insulating film, 217 . . . Planarizing film, 218 . . . Color filters, 219 . . . Microlenses, 230 . . . Interconnect layer, 231 . . . Gate layer, 232 . . . First metal layer, 233 . . . Second metal layer, 234 . . . First interlayer insulating layer, 235 . . . Second interlayer insulating layer, 300 . . . Imaging apparatus, 311 . . . Optics, 313 . . . DSP, 314 . . . Frame memory, 315 . . . Display apparatus, 316 . . . Recording apparatus, 317 . . . Operation system, 318 . . . Power supply system, 319 . . . Control section, 11402 . . . Image pickup unit, 12031 . . . Imaging section, 12101 to 12105 . . . Imaging sections, AMP . . . Amplifying transistor, Ct1 to Ct3 . . . Contacts, FD . . . Floating diffusion, FD1 . . . First region, FD2 . . . Second region, Gtg . . . Transfer gate electrode, Gamp . . . Amplifying gate electrode, Grst . . . Reset gate electrode, Gsel . . . Select gate electrode, HSLn . . . Pixel drive lines, JS . . . Light-receiving surface, L0 . . . FD interconnect, L1 . . . Layer interconnect, L2 . . . Different layer interconnect, Lrst . . . Signal line, Lsel . . . Signal line, Ltrf . . . Horizontal signal line, Ltrg . . . Signal line, PD . . . Photodiode, PX . . . Pixels, PX1 . . . Pixel, PX2 . . . Pixel, RST . . . Reset transistor, SEL . . . Select transistor, T1 . . . Input terminal, T2 . . . Input terminal, T3 . . . Output terminal, TG . . . Transfer transistor, VDD . . . Constant voltage source, VDD . . . Constant voltage section, VSLm . . . Vertical signal lines

The invention claimed is:
1. A solid-state imaging element, comprising:
a plurality of pixels in a two-dimensional arrangement, wherein
the plurality of pixels includes a first pixel and a second pixel,
each pixel of the plurality of pixels includes a transistor element and a photodiode,
the photodiode in each pixel of the plurality of pixels is configured to generate electrons,
the first pixel is configured to convert a unit quantity of the electrons, generated by the photodiode of the first pixel, into a first analog voltage with a first conversion efficiency, and
the second pixel is configured to convert a unit quantity of the electrons, generated by the photodiode of the second pixel, into a second analog voltage with a second conversion efficiency; and
an AD conversion section configured to convert each of the first analog voltage and the second analog voltage into a respective digital signal, wherein
the first conversion efficiency of the first pixel is different from the second conversion efficiency of the second pixel, and
a gate of the transistor element in the first pixel is different from a gate of the transistor element in the second pixel in at least one of a shape, a size, or a layout.
2. The solid-state imaging element of claim 1, wherein the first pixel is at a center portion of the two-dimensional arrangement of the plurality of pixels and the second pixel is at a peripheral portion of the two-dimensional arrangement of the plurality of pixels.
3. The solid-state imaging element of claim 1, wherein each of the first pixel and the second pixel further includes a floating diffusion and a plurality of metal interconnects, and
at least one of a structure of the floating diffusion in the first pixel is different from a structure of the floating diffusion in the second pixel, or a structure of the plurality of metal interconnects in the first pixel is different from a structure of the plurality of metal interconnects in the second pixel.
4. The solid-state imaging element of claim 3, wherein at least one of a shape, a size, or a layout of the plurality of metal interconnects in the first pixel is different from that of the plurality of metal interconnects in the second pixel.

5. The solid-state imaging element of claim 3, wherein at least one of a shape, a size, or a layout of the floating diffusion in the first pixel is different from that of the floating diffusion in the second pixel.

6. The solid-state imaging element of claim 3, wherein a thickness of a gate insulating film of the transistor element in the first pixel is different from a thickness of a gate insulating film of the transistor element in the second pixel.

7. The solid-state imaging element of claim 1, wherein
each of the first pixel and the second pixel further includes a floating diffusion, and
a concentration of an N-type impurity in a diffusion layer of the floating diffusion in the first pixel is different from a concentration of the N-type impurity in a diffusion layer of the floating diffusion in the second pixel.

8. An electronic equipment, comprising:
a solid-state imaging element including:
 a plurality of pixels in a two-dimensional arrangement, wherein
  the plurality of pixels includes a first pixel and a second pixel,
  each pixel of the plurality of pixels includes a transistor element and a photodiode,
  the photodiode in each pixel of the plurality of pixels is configured to generate electrons,
  the first pixel is configured to convert a unit quantity of the electrons, generated by the photodiode of the first pixel, into a first analog voltage with a first conversion efficiency, and
  the second pixel is configured to convert a unit quantity of the electrons, generated by the photodiode of the second pixel, into a second analog voltage with a second conversion efficiency; and
an AD conversion section configured to convert each of the first analog voltage and the second analog voltage into a respective digital signal, wherein
 the first conversion efficiency of the first pixel is different from the second conversion efficiency of the second pixel, and
 a gate of the transistor element in the first pixel is different from a gate of the transistor element in the second pixel in at least one of a shape, a size, or a layout.

* * * * *